(12) United States Patent
Inoue

(10) Patent No.: US 7,116,187 B2
(45) Date of Patent: Oct. 3, 2006

(54) SAW ELEMENT AND SAW DEVICE

(75) Inventor: Kenji Inoue, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/699,779

(22) Filed: Nov. 4, 2003

(65) Prior Publication Data

US 2004/0090288 A1 May 13, 2004

Related U.S. Application Data

(62) Division of application No. 10/253,988, filed on Sep. 25, 2002, now abandoned.

(30) Foreign Application Priority Data

| Sep. 25, 2001 | (JP) | ............... 2001-292470 |
| Sep. 25, 2001 | (JP) | ............... 2001-292471 |
| Sep. 25, 2001 | (JP) | ............... 2001-292472 |
| Sep. 28, 2001 | (JP) | ............... 2001-301854 |
| Nov. 16, 2001 | (JP) | ............... 2001-352450 |

(51) Int. Cl.
*H03H 9/64* (2006.01)
*H03H 9/72* (2006.01)

(52) U.S. Cl. .................. 333/133; 333/193; 333/195

(58) Field of Classification Search ........ 333/193–196, 333/133; 310/313 B, 313 D
See application file for complete search history.

(56) References Cited

U.S. PATENT DOCUMENTS

| 5,486,800 | A | * | 1/1996 | Davenport | .................. 333/193 |
| 5,682,126 | A | * | 10/1997 | Plesski et al. | ............... 333/193 |
| 5,905,418 | A | * | 5/1999 | Ehara et al. | ................ 333/193 |
| 5,933,062 | A | * | 8/1999 | Kommrusch | ................ 333/193 |
| 5,963,113 | A | * | 10/1999 | Ou et al. | .................... 333/193 |
| 5,999,069 | A | * | 12/1999 | Ushiroku | .................... 333/193 |
| 6,031,435 | A | | 2/2000 | Inose et al. | ................. 333/193 |
| 6,043,585 | A | * | 3/2000 | Plessky et al. | .......... 310/313 R |
| 6,150,904 | A | * | 11/2000 | Taniguchi et al. | .......... 333/193 |
| 6,208,224 | B1 | * | 3/2001 | Taniguchi et al. | .......... 333/193 |

(Continued)

FOREIGN PATENT DOCUMENTS

JP  5-183380  7/1993

(Continued)

OTHER PUBLICATIONS

"High Rejection Impedance Element Saw Filters Realised on Quartz and 42 -Lita03 Substrates", S. N. Kondratiev and T. Thorvaldsson, 2000 IEEE Ultrasonics Symposium, pp. 109-112.

(Continued)

*Primary Examiner*—Barbara Summons
(74) *Attorney, Agent, or Firm*—McGinn IP Law Group, PLLC

(57) ABSTRACT

The SAW element 11 comprises a serial arm 17 formed between an input terminal 15 and an output terminal 16, two serial arm side SAW resonators 20 located in the serial arm 17, at least three parallel arms 19 connected between the serial arm 17 and a reference potential terminal 18, and parallel arm side SAW resonator 21 located in the parallel arms 19, respectively. Each of these parallel arm side SAW resonators 21 has an anti-resonant frequency corresponding with the predetermined resonant frequency of each serial arm side SAW resonator 20. Further, at least one parallel arm side SAW resonator 21 has a resonant frequency different from those of the other parallel arm side SAW resonators 21. Thereby, not only insertion loss can be prevented from being deteriorated but also an attenuation characteristic of the SAW element 11 can be readily varied.

23 Claims, 26 Drawing Sheets

U.S. PATENT DOCUMENTS 6,297,712 B1 * 10/2001 Kadota et al. ............... 333/133
6,351,197 B1 * 2/2002 Selmeier et al. ............ 333/195
6,369,672 B1 * 4/2002 Ikada ......................... 333/193
6,469,593 B1 * 10/2002 Nishizawa et al. ......... 333/133
6,489,863 B1 * 12/2002 Taniguchi .................... 333/193
6,557,225 B1 * 5/2003 Takata et al. ............... 29/25.35
6,570,470 B1 * 5/2003 Maehara et al. ............ 333/193
6,747,530 B1 * 6/2004 Selmeier ..................... 333/193

FOREIGN PATENT DOCUMENTS

| JP | 9-261002 | * | 10/1997 |
| JP | 10-93382 | * | 4/1998 |
| JP | 11-330904 | * | 11/1999 |
| JP | 2000-91880 | * | 3/2000 |
| JP | 2001-127589 | * | 5/2001 |

OTHER PUBLICATIONS

European Search Report dated May 8, 2006.

* cited by examiner

SAW ELEMENT AND SAW DEVICE

The present Application is a Divisional Application of U.S. patent application Ser. No. 10/253,988, filed on Sep. 25, 2002, now abandoned.

BACKGROUND OF THE INVENTION

The present invention relates to an SAW (Surface Acoustic Wave) element which is composed of a plurality of SAW resonators, and an SAW device in which the SAW element is mounted, in particular to a technique effectively applicable to the SAW element of which a ladder-type circuit is constituted by these SAW resonators. Further, the present invention is also applied to a dual-type filter and a branching filter each of which is using a plurality of SAW elements. Furthermore, the present invention also relates to a technique effectively applicable in particular to reduction of coupling between a plurality of SAW elements.

In recent years, a mobile communication terminal equipment, such as a portable telephone, and the like has been rapidly progressed. From the viewpoint of convenience of portability or handiness, it is strongly desired that the mobile communication terminal equipment is not only small in size but also light in weight. In order to fabricate such a small and a light terminal equipment, it is essentially required that an electronic part or device used therein is also small in size and light in weight. Under the circumstances, many SAW elements, each of which has advantage for being fabricated small and light and each of in which a plurality of SAW resonators are formed in a piezo-electric substrate, have been used in a high-frequency section and an intermediate-frequency section of the terminal equipment.

An insertion loss and attenuation outside the pass band can be pointed out as important characteristics required for the SAW element, when the SAW element is used as a filter. Herein, the insertion loss influences power consumption of the mobile communication terminal equipment including the SAW element. The insertion loss becomes lower, the life of a battery included in the mobile communication terminal equipment becomes longer. Therefore, a capacity of the battery can be reduced, dependent on the insertion loss. Accordingly, the mobile communication terminal equipment can be fabricated small in size and light in weight, when the insertion loss can be low. Further, when wide range attenuation outside the pass band can be obtained in a filter, the mobile communication terminal equipment can also be fabricated small in size and light in weight.

In a known example of the SAW element, a serial arm is formed between input and output terminals while a plurality of parallel arms are formed between the serial arm and a reference potential terminal, and then SAW resonators are adequately located in these serial and parallel arms.

In such an SAW element, a resonant frequency of the SAW resonator located in the serial arm is adjusted to be corresponding with an anti-resonant frequency of the SAW resonator located in the parallel arm. Thereby, an input and output impedance is matched with a characteristic impedance around the frequencies corresponding with each other. The pass band is thereby constituted.

As regards an SAW element used as a band filter, it is strongly desired that the insertion loss is low and that amount of attenuation is enlarged in a frequency range outside the pass band.

Further, in a mounting of the SAW elements used in such an SAW device, it is carried out that an SAW element at the transmission side (a transmission filter) and an SAW element at the reception side (a reception filter) are mounted on a mounting substrate separately from each other. On the other hand, it is sometimes carried out that the transmission filter and the reception filter are mounted in a body on the mounting substrate. In these mountings, each of the transmission filter and the reception filter is mounted in the respective direction. As a result, due to the directions in which the transmission filter and the reception filter are mounted, coupling is sometimes caused to occur between the transmission filter and the reception filter. Consequently, a frequency characteristic of the SAW device is sometimes influenced by the coupling. Such an influence on the frequency characteristic due to the coupling is a serious problem regarding characteristics of the SAW device itself. It is therefore necessary to remove the influence as completely as possible.

As important characteristics required for the SAW device, it should be pointed out that an insertion loss is low and that amount of attenuation outside the pass band frequency is large. The insertion loss influences power consumption of the mobile communication terminal equipment. The insertion loss becomes lower, the life of a battery included in the mobile communication terminal equipment becomes longer. Therefore, a capacity of the battery can be reduced, dependent on the insertion loss. Accordingly, the mobile communication terminal equipment can be fabricated small in size and light in weight, when the insertion loss can be low. Further, when wide range attenuation outside the pass band can be obtained in an SAW device, the mobile communication terminal equipment can also be fabricated small in size and light in weight.

Herein, the SAW element used in the SAW device has a pair of exciting electrode portions each of which has a shape of the teeth of a comb and which are formed on a piezo-electric substrate with being involved in each other. With the structure, in the SAW element, an electric field generated by applying voltage between the exciting electrode portions produces a surface acoustic wave (SAW) on the piezo-electric substrate. On the other hand, a produced surface acoustic wave (SAW) is converted into an electric signal by the exciting electrode portions also in the SAW element. Herein, a film thickness of each exciting electrode portion is an important parameter for determining the pass band frequency as a filter. For example, in order that the pass band frequency may be enhanced from 1 GHz into 2 GHz, the film thickness 0.4 µm at the frequency 1 GHz must be reduced to a half of that, namely, the film thickness 0.2 µm at the frequency 2 GHz. Such reduction of the film thickness inevitably makes an area of section of a conductor pattern be small. As a result, an electric resistance value of the conductor pattern is increased. Accordingly, the above-mentioned insertion loss becomes high. Further, the amount of attenuation outside the pass band frequency cannot be obtained sufficiently. Thus, characteristics of the SAW element are deteriorated.

SUMMARY OF THE INVENTION

It is therefore an object of the present invention to provide an SAW element and an SAW device each of which is not only capable of preventing an insertion loss thereof from being deteriorated but also capable of readily changing attenuation characteristics thereof.

It is another object of the present invention to provide an SAW element and an SAW device each of which is capable of enlarging the amount of attenuation at a frequency range outside the pass band without making inductance small and increasing the insertion loss.

It is yet another object of the present invention to provide an SAW device which is capable of reducing the coupling generated between a plurality of SAW elements mounted on the SAW device.

It is still another object of the present invention to provide a technique for an SAW element which is capable of preventing characteristics thereof from being deteriorated by enhancing the pass band frequency.

According to an aspect of the present invention, there is provided an SAW element comprising:
  a serial arm formed between input and output terminals;
  two serial arm side SAW resonators each of which has a predetermined resonant frequency and which are located in said serial arm with said serial arm being positioned between the two serial arm side SAW resonators;
  at least three parallel arms formed between said serial arm and a reference potential terminal; and
  parallel arm side SAW resonators each of which has an anti-resonant frequency corresponding with said predetermined resonant frequency of said serial arm side SAW resonator, at least one of said parallel arm side SAW resonators having a resonant frequency different from that of the other parallel arm side SAW resonators.

According to another aspect of the present invention, there is provided an SAW device in which an SAW element is mounted, said SAW element including a ladder-type circuit which has a serial arm formed between input and output terminals and which has a plurality of parallel arms formed between said serial arm and a reference potential terminal, said SAW device comprising:
  a plurality of first SAW resonators which are located in said serial arm and each of which has a predetermined resonant frequency;
  second SAW resonators which are located in said a plurality of parallel arms, respectively and each of which has an anti-resonant frequency corresponding with said predetermined resonant frequency of said each first SAW resonator; and
  capacitance means which have a predetermined electrostatic capacity and which are located between said parallel arm positioned in the nearest position of said input terminal and said parallel arm positioned in the nearest position of said output terminal.

According to yet another aspect of the present invention, there is provided an SAW element comprising:
  a first wiring portion formed between input and output terminals;
  a plurality of second wiring portions formed between said first wiring portion and a reference potential terminal;
  at least two single unit elements;
  each of said single unit elements including:
    a first SAW resonator which is located in said first wiring portion and which has a predetermined resonant frequency and a predetermined anti-resonant frequency;
    a second SAW resonator which is connected to said second wiring portion of the side of said input terminal of said first SAW resonator and which has an anti-resonant frequency corresponding with said predetermined resonant frequency of said first SAW resonator;
    a third SAW resonator which is connected to said second wiring portion of the side of said output terminal of said first SAW resonator and which has an anti-resonant frequency corresponding with said predetermined resonant frequency of said first SAW resonator;
    a first connection point for connecting said second SAW resonator of the side of said reference potential terminal and said third SAW resonator of the side of said reference potential terminal with each other; and
    a first inductance element which is located between said first connection point and said reference potential terminal.

According to still another aspect of the present invention, there is provided an SAW device comprising:
  a mounting substrate on which a predetermined conductor pattern is formed;
  a first SAW element which is mounted on said mounting substrate by a flip-chip mounting, said first SAW element having a piezo-electric substrate and an SAW resonator formed on said piezo-electric substrate, said first SAW element further having input and output terminals which are formed in one of the both sides of a central axis of said piezo-electric substrate and which are electrically connected to said SAW resonator; and
  a second SAW element which is mounted on said mounting substrate adjacent to said first SAW element by a flip-chip mounting, said second SAW element having a piezo-electric substrate and an SAW resonator formed on said piezo-electric substrate, said second SAW element further having input and output terminals which are formed in the side remote from said first SAW element and which are electrically connected to said SAW resonator, said input and output terminals being formed in the side remoter from said first SAW element than from said central axis of said piezo-electric substrate.

According to further another aspect of the present invention, there is provided an SAW element comprising:
  a piezo-electric substrate;
  a pair of exciting electrode portions each of which has a shape of the teeth of a comb with being involved in each other and having a first film thickness and which are formed on said piezo-electric substrate, said pair of exciting electrode portions being made of at least aluminum or aluminum alloy, said pair of exciting electrode portions producing a surface acoustic wave (SAW) on said piezo-electric substrate while the surface acoustic wave (SAW) thereby being converted into an electric signal;
  a terminal electrode portion from which an electric signal is inputted or outputted; and
  a wiring portion at least a part of which has a second film thickness larger than said first film thickness and which is formed on said piezo-electric substrate, said wiring portion being made of at least aluminum or aluminum alloy and electrically connecting said exciting electrode portion with said terminal electrode portion or said exciting electrode portions with each other.

DETAILED DESCRIPTION OF THE PREFERRED EMBODIMENTS

Figure 29:
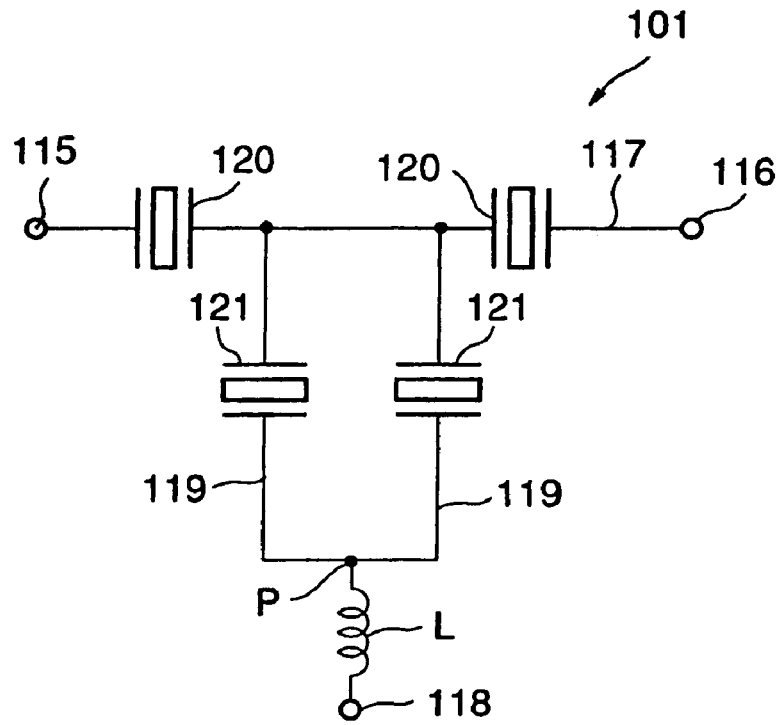
FIG. 29 is an explanation view for schematically showing a circuit of a first conventional SAW element.
Figure 30:
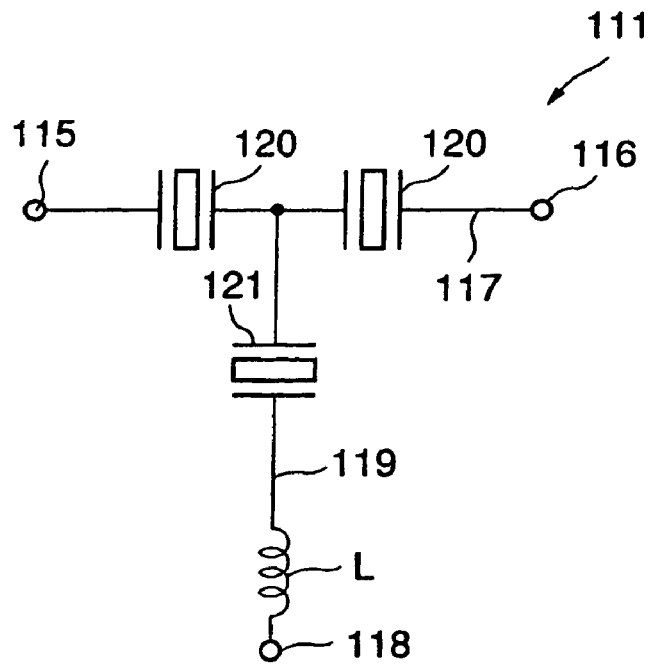
FIG. 30 is an explanation view for schematically showing a circuit of a second conventional SAW element.
Figure 31:
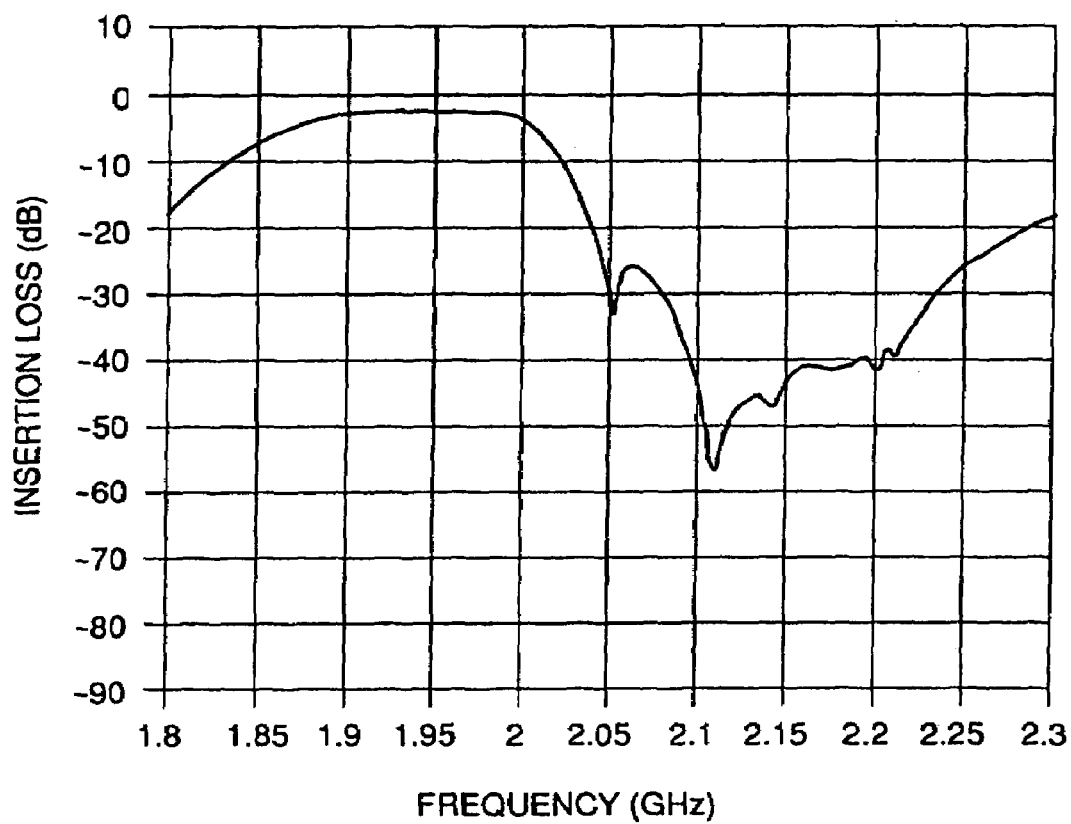
FIG. 31 is a graph for showing a frequency characteristic of the SAW element illustrated in FIG. 30.

Referring to FIGS. 29 through 31, description is, at first, made about first and second conventional SAW elements in order to facilitate an understanding of the present invention. FIG. 29 shows a circuit diagram of the first conventional SAW element.

The SAW element 101 illustrated in FIG. 29 comprises a serial arm 117 formed between an input terminal 115 and an output terminal 116, two serial arm side SAW resonators 120 which are located in the serial arm 117 with a part of the serial arm 117 being positioned between the two serial arm side SAW resonators 120, two parallel arms 119 formed between the serial arm 117 and a reference potential terminal 118, two parallel arm side SAW resonators 121 which are located in the two parallel arms 119, respectively, and an inductance element L located between the reference potential terminal 118 and a connection point P connecting the two parallel arms 119 with each other at the side of the reference potential terminal 118 of the parallel arm side SAW resonators 121, respectively.

With the circuit constitution being illustrated, a predetermined attenuating amount can be obtained in a reception frequency band by determining a value of the inductance element L to be about several nHs. However, even in the circuit constitution, an insertion loss is deteriorated. It is therefore difficult that both the requirements of low insertion loss and high attenuating amount are satisfied.

FIG. 30 shows a circuit diagram of the second conventional SAW element while FIG. 31 shows a frequency characteristic of the second conventional SAW element.

The SAW element 111 illustrated in FIG. 30 comprises a serial arm 117 formed between an input terminal 115 and an output terminal 116, two serial arm side SAW resonators 120 which are located in the serial arm 117 with a part of the serial arm 117 being positioned between the two serial arm side SAW resonators 120, a parallel arm 119 formed between the part of the serial arm 117 and a reference potential terminal 118, a parallel arm side SAW resonator 121 which is located in the parallel arm 119, and an inductance element L located between the reference potential terminal 118 and the parallel arm side SAW resonator 121.

The second conventional SAW element has a frequency characteristic, as illustrated in FIG. 31. In the second conventional SAW element, an insertion loss can be prevented from being deteriorated. However, in the second conventional SAW element, an attenuation characteristic thereof cannot be changed so freely. Accordingly, it is sometimes difficult to obtain a desirable attenuation characteristic.

Figure 1:
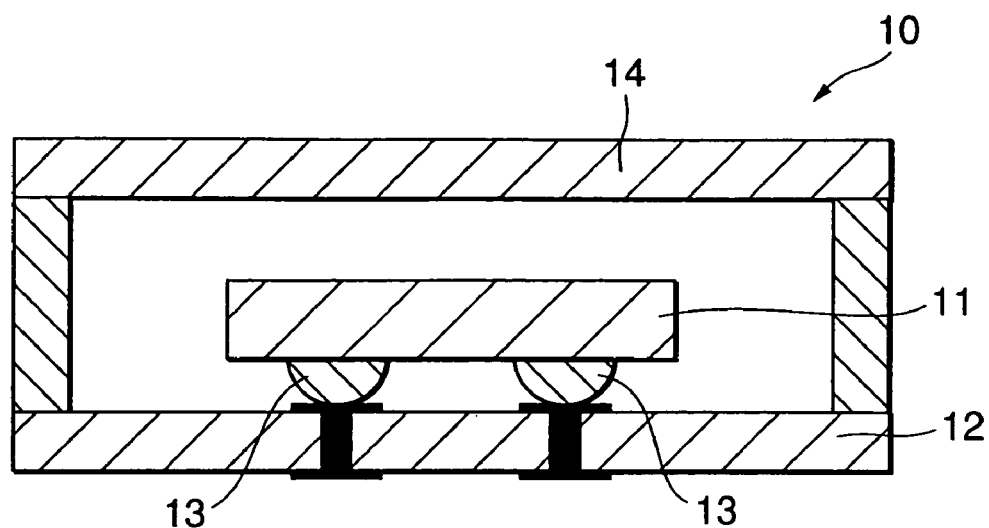
FIG. 1 is a sectional view for schematically showing an SAW device in which an SAW element is packaged according to an embodiment of the present invention.
Figure 2:
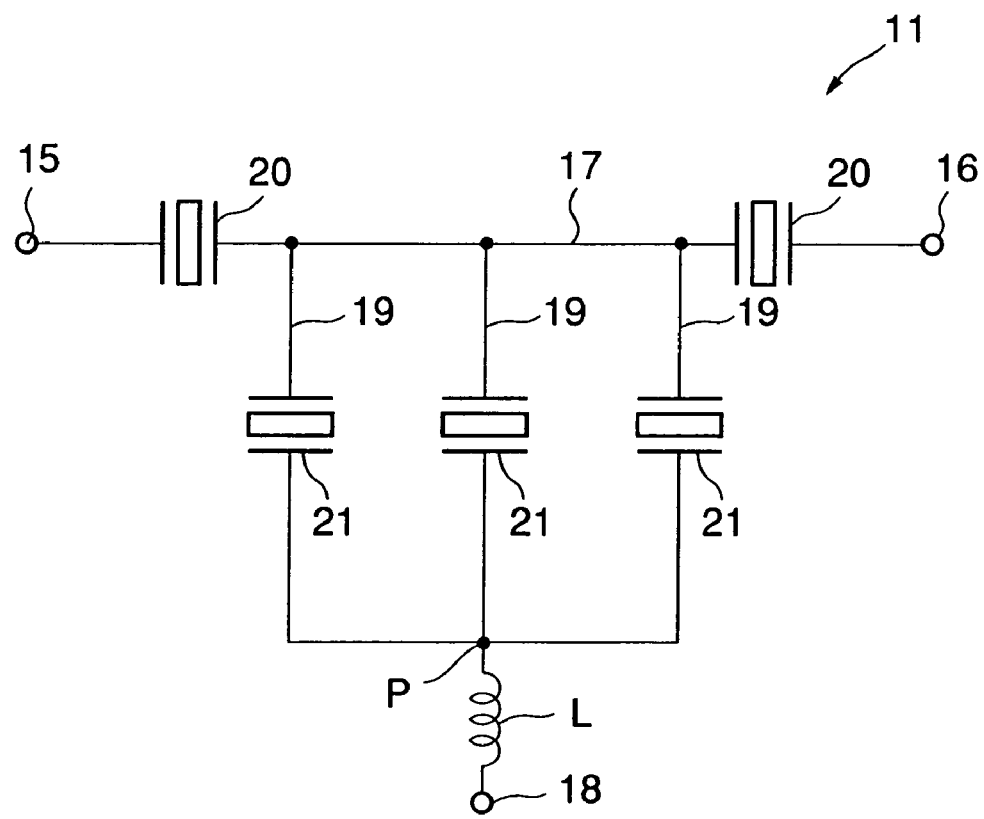
FIG. 2 is a circuit diagram for schematically showing an equal circuit of an SAW element according to a first embodiment of the present invention.
Figure 3:
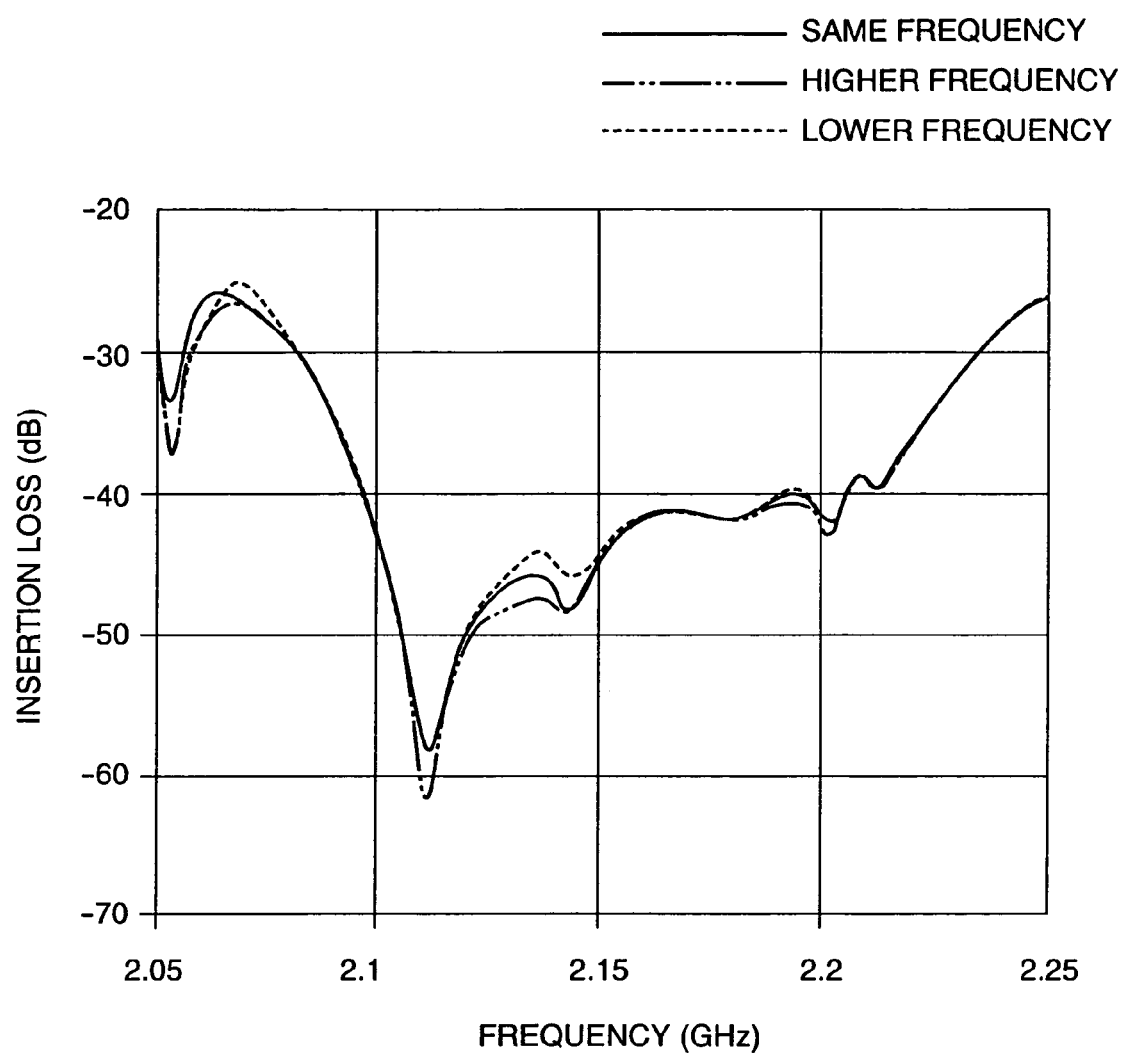
FIG. 3 is a graph for showing a characteristic of a relation between attenuation amounts and frequencies in the SAW element illustrated in FIG. 2.

Now, referring to FIGS. 1 through 3, description will proceed to an SAW element and an SAW device according to a first embodiment of the present invention. FIG. 1 is a sectional view for showing an SAW device in which an SAW element of the embodiment of the present invention is packaged. FIG. 2 is a circuit diagram for showing an equal circuit of the SAW element according to the first embodiment of the present invention. FIG. 3 is a graph for showing a characteristic of a relation between attenuating amount and frequencies in the SAW element illustrated in FIG. 2.

The SAW filter device (SAW device) 10 illustrated in FIG. 1 comprises a plurality of SAW filters (SAW element) 11 which are mounted on a mounting substrate 12. The mounting substrate 12 is made of ceramic or resin. Predetermined wiring pattern and circuit pattern which are composed of one or a plurality of layers are formed in the mounting substrate 12. The SAW filter (SAW element) 11 includes a plurality of SAW resonators which are located on predetermined positions of a piezo-electric substrate, respectively. Each of the SAW resonators is composed of a pair of electrodes (not shown) each having a shape of the teeth of a comb with being involved in each other. The pair of electrodes (not shown) produce a surface acoustic wave by an electric field or convert the surface acoustic wave into an electric signal.

In the illustrated example, an element-forming surface of the SAW filter 11 is located to be opposite to the mounting substrate 12. Further, the SAW filter 11 and the mounting substrate 12 are connected to each other by flip-chip bonding through bumps 13. Alternatively, the SAW filter 11 and the mounting substrate 12 may be wirily connected to each other by wire bonding.

Herein, a reflector for amplifying the surface acoustic wave is formed at the both sides of the above-mentioned pair of electrodes (not shown). Further, the piezo-electric substrate is formed by a piezo-electric single crystal, such as LiNbO3, LiTaO3, crystal, and the like, or formed by piezo-electric ceramics, such as lead titanate zirconate piezo-electric ceramics. Alternatively, an insulating substrate on which a piezo-electric thin film, such as a ZnO thin film, and the like is formed may be used as the piezo-electric substrate.

Turning to FIG. 1, a cap 14 is adhered to the mounting substrate 12 with the SAW filter 11 being surrounded by the cap 14. The SAW filter 11 is thereby protected from dust or mechanical impact.

As illustrated in FIG. 2, the SAW filter 11 mounted on the SAW filter device 10 comprises a serial arm 17 formed between an input terminal 15 and an output terminal 16, three parallel arms 19 connected between the serial arm 17 and a reference potential terminal 18. Accordingly, a ladder-type circuit is constituted by the serial arm 17 and the parallel arms 19.

In FIG. 2, two serial arm side SAW resonators 20 each having a predetermined resonant frequency are located in the serial arm 17 in serial to each other with a part of the serial arm 17 being positioned between the two serial arm side SAW resonators 20. The three parallel arms 19 are located between the part of the serial arm 17 and the reference potential terminal 18. Three parallel arm side SAW resonators 21 are located in the three parallel arms 19, respectively.

Each of these parallel arm side SAW resonators 21 has an anti-resonant frequency corresponding with the predetermined resonant frequency of each serial arm side SAW resonator 20. Further, at least one parallel arm side SAW resonator 21 has a resonant frequency different from those of the other parallel arm side SAW resonators 21. Besides, frequency characteristics of the parallel arm side SAW resonators 21 can be varied by changing conditions, such as transposition width of electrodes, numbers of pairs of electrodes, or the like.

Besides, in this embodiment, three parallel arms 19 are located between the part of the serial arm 17 and the reference potential terminal 18, as mentioned above. However, not fewer than four parallel arms may be located therebetween. Therefore, not fewer than four parallel arm side SAW resonators may be located in the not fewer than four parallel arms, respectively. Herein, "anti-resonant frequency corresponding with the predetermined resonant frequency of each serial arm side SAW resonator" in this specification does not require that the both frequencies are strictly corresponding with each other. It is enough that the both frequencies are corresponding with each other to perform a predetermined function, such as a function of a filter, and the like.

Further, an inductance element L is located between the reference potential terminal 18 and a connection point P connecting the three parallel arms 19 with each other at the side of the reference potential terminal 18 of the parallel arm side SAW resonators 21, respectively. Besides, in this embodiment, a value of inductance of the inductance element L is not smaller than 0.5 nH while inductor Q is not smaller than 10.

Referring to FIG. 3 with reference to FIG. 2 continued, description proceeds to frequency characteristics of the SAW filter 11 according to this embodiment of the present invention. In the SAW filter 11 according to this embodiment, the three parallel arms 19 are located between the part of the serial arm 17 and the reference potential terminal 18. Three parallel arm side SAW resonators 21 are located in the three parallel arms 19, respectively. As a result, an impedance of each parallel arm side SAW resonator 21 becomes smaller. Consequently, an insertion loss can be prevented from being deteriorated.

In FIG. 3, illustrated is a graph in which a frequency characteristic of one parallel arm side SAW resonator 21 positioned in the central of FIG. 2 is varied. In FIG. 3, the continuous line shows a case that the frequency characteristic of the central parallel arm side SAW resonator 21 is rendered to be the same as those of the other parallel arm side SAW resonators 21, the two-dot chain line shows a case that the frequency characteristic of the central parallel arm side SAW resonator 21 is rendered to be higher frequency than those of the other parallel arm side SAW resonators 21, the broken line shows a case that the frequency characteristic of the central parallel arm side SAW resonator 21 is rendered to be lower frequency than those of the other parallel arm side SAW resonators 21, respectively.

As will be understood from FIG. 3, an attenuation characteristic is varied by changing the frequency characteristic of the central parallel arm side SAW resonator 21. Accordingly, it will be realized that the attenuation characteristic is further varied by changing frequency characteristics of further one or two parallel arm side SAW resonators 21 in addition to the central parallel arm side SAW resonator 21.

Thus, an attenuation characteristic of the SAW filter 11 can be readily varied by making at least one parallel arm side SAW resonator 21 have a resonant frequency different from those of the other parallel arm side SAW resonators 21. Thereby, number of degrees of freedom in designing the SAW filter 11 is improved. Accordingly, it becomes possible to meet various requirements required for the SAW filter 11.

Further, as mentioned before, since three parallel arms 19 are formed to have the parallel arm side SAW resonators 21, respectively, bulk loss can be reduced in this embodiment. Namely, bulk loss is inevitably caused to occur in an SAW resonator. Characteristics of the SAW resonator are sometimes deteriorated due to the bulk loss. Herein, it is assumed that an impedance of the above-mentioned parallel arm side SAW resonator 121 depicted in FIG. 30 is Zp. If it is also assumed that each impedance (P1, P2, P3) of each parallel arm side SAW resonator 21 located in each of the three parallel arms 19 is the same as Zp, namely, (P1=P2=P3=Zp), combined resistance component of these P1, P2 and P3 becomes Zp/3. Consequently, bulk loss is reduced as the SAW filter 11.

Besides, the above description was made about the SAW filter device 10 on which only one SAW filter 11 is mounted. The SAW filter of the present invention can be applied to various types of SAW filter devices. For example, two SAW filters 11 having center frequencies different from each other may be mounted on the SAW filter device to produce a branching filter. Further, the present invention is not restricted to a filter. The present invention can be applied to various SAW devices of the fields other than filters, on which one or a plurality of SAW elements are mounted.

As will be clearly understood from the above description, the following meritorious effects can be obtained according to this embodiment of the present invention. An impedance of each parallel arm side SAW resonator 21 becomes smaller, so that insertion loss can be prevented from being deteriorated. In addition, an attenuation characteristic of the SAW filter 11 can be readily varied by making at least one parallel arm side SAW resonator 21 have a resonant frequency different from those of the other parallel arm side SAW resonators 21. Thereby, number of degrees of freedom in designing the SAW filter 11 is improved. Accordingly, it becomes possible to meet various requirements required for the SAW filter 11. Further, since three parallel arms 19 are formed to have the parallel arm side SAW resonators 21, respectively, bulk loss can be reduced in this embodiment.

Figure 32:
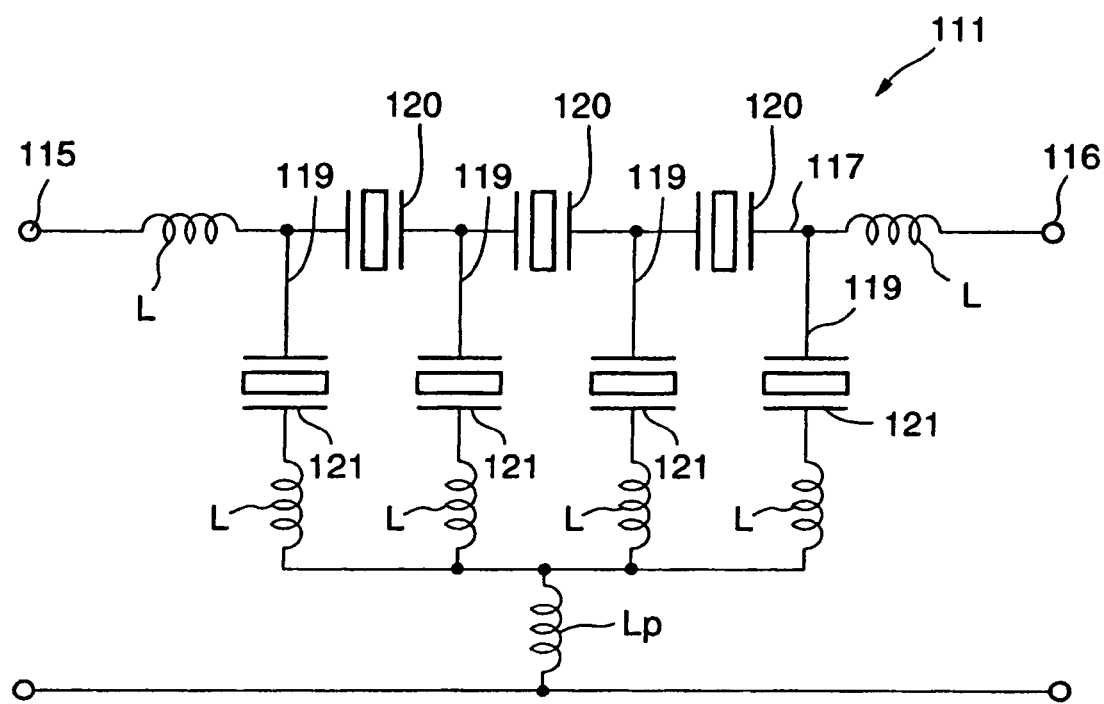
FIG. 32 is a circuit diagram for schematically showing an equal circuit of a third conventional SAW element.

Next, referring to FIG. 32, description is made about a third conventional SAW element in order to facilitate an understanding of the present invention. FIG. 32 shows a circuit diagram of the third conventional SAW element.

In the SAW element 111 illustrated in FIG. 32, a plurality of (three) serial arm side SAW resonators 120 are located in the serial arm 117. Further, parallel arms 119 are formed between an input terminal 115 and the serial arm side SAW resonator 120 of the nearest position to the input terminal 115, between an output terminal 116 and the serial arm side SAW resonator 120 of the nearest position to the output terminal 116, and between the serial arm side SAW resonators 120, respectively. In addition, parallel arm side SAW resonators 121 are located in these parallel arms 119, respectively.

Besides, reference numerals L in FIG. 32 represent inductance component contained between a chip of the SAW element 111 and a package for mounting the chip (wirings, bumps, bonding wires, or the like). Further, a reference numeral Lp in FIG. 32 represents inductance component contained in a path from connecting pads on the package to the ground of the side of device. With the structure, not only a predetermined pass-band frequency is acquired but also a desirable attenuation is obtained at the frequency side lower than the pass-band frequency, by designing a value of the inductance component Lp to be very small (not larger than 0.03 nH) and adequately selecting a value of the inductance component L.

However, in the technique depicted in FIG. 32, it is substantially difficult to make the value of the inductance component Lp be small, on the ground that wirings are drawn around the chip. Further, it is very difficult to measure the value of the inductance component Lp actually. Accordingly, try and error in actual measurement was essentially required. Since an inner portion of the package particularly has a three-dimensional structure, a change of design required as the result of the try and error was sometimes very difficult.

Figure 5:
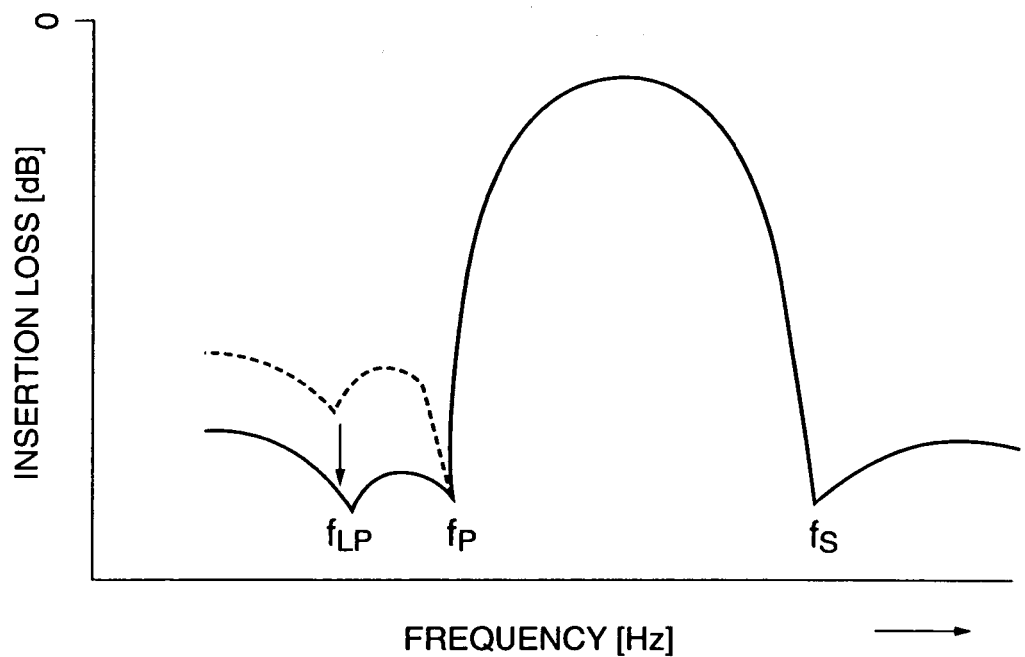
FIG. 5 is a graph for showing a characteristic of a relation between attenuation amounts and frequencies in the SAW element illustrated in FIG. 4.

If the value of the inductance component Lp cannot be made sufficiently small, an attenuating pole fLP cannot achieve a sufficient attenuating amount. As illustrated in FIG. 5, only the characteristic depicted by a broken line in FIG. 5 can be obtained. In order to solve these problems, an embodiment of the present invention will be described below.

Figure 4:
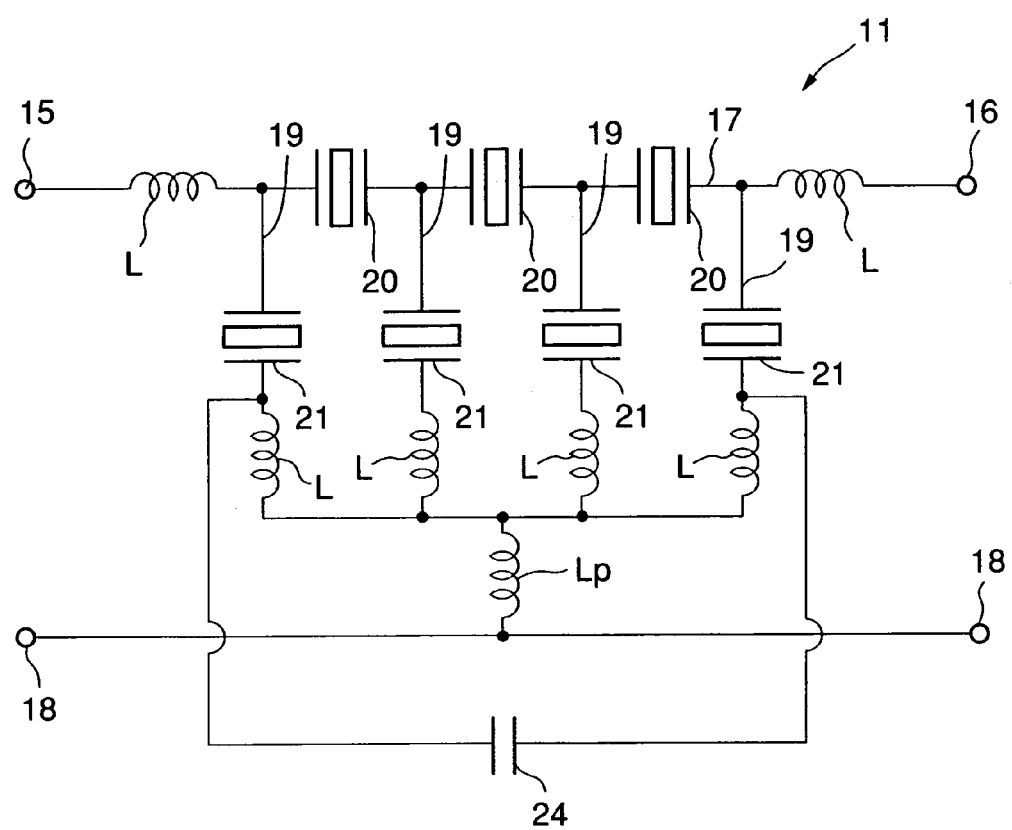
FIG. 4 is a circuit diagram for schematically showing an equal circuit of an SAW element according to a second embodiment of the present invention.

Namely, referring to FIGS. 4 and 5, description will proceed to an SAW element according to a second embodiment of the present invention. FIG. 4 is a circuit diagram for showing an equal circuit of the SAW element according to the second embodiment of the present invention while FIG. 5 is a graph for showing a characteristic of a relation between attenuating amount and frequencies in the SAW element illustrated in FIG. 4. In FIG. 5, an attenuating pole fp is a resonant frequency by the SAW resonators in the parallel arms while an attenuating pole fs is a resonant frequency by the SAW resonators in the serial arm.

As illustrated in FIG. 4, in the SAW filter 11, a serial arm 17 is formed between an input terminal 15 and an output terminal 16. Further, a plurality of (four) parallel arms 19 are connected between the serial arm 17 and reference potential terminals 18. Accordingly, an RADA-type circuit is constituted by the serial arm 17 and the parallel arms 19.

In the serial arm 17, a plurality of (three) first SAW resonators 20 are located in serial to each other. Besides, three first SAW resonators 20 are located in this embodiment. Alternatively, two first SAW resonators 20 and four or more first SAW resonators 20 may be located in serial to each other. Further, the parallel arms 19 are formed between an input terminal 15 and the first SAW resonator 20 of the nearest position to the input terminal 15, between an output terminal 16 and the first SAW resonator 20 of the nearest position to the output terminal 16, and between the first SAW resonators 20 adjacent to each other, respectively. In addition, second SAW resonators 21 are located in these parallel arms 19, respectively. Each of these second SAW resonators 21 has an anti-resonant frequency corresponding with the resonant frequency of each of the first SAW resonators. Herein, "anti-resonant frequency corresponding with the resonant frequency of each of the first SAW resonators" in this specification does not require that the both frequencies are strictly corresponding with each other. It is enough that the both frequencies are corresponding with each other to perform a predetermined function, such as a function of a filter, and the like.

Further, capacitance means 24 having a predetermined electrostatic capacity is located between the parallel arm 19 of the nearest position to the input terminal 15 and the parallel arm 19 of the nearest position to the output terminal 16. Herein, the capacitance means 24 may be formed on a chip as a part of a circuit of the SAW filter 11. Further, the capacitance means 24 may be formed on a mounting substrate 12 on which the SAW filter 11 is mounted. Besides, the capacitance means 24 may be formed on the mounting substrate 12 by mounting an electronic part, such as a chip condenser, and the like, thereon.

Further, in the circuit depicted in FIG. 4, reference numerals L represent inductance component contained between a chip of the SAW filter 11 and a package for mounting the chip (wirings, bumps, bonding wires, or the like). Further, a reference numeral Lp represents inductance component contained in a path from connecting pads on the package to the ground of the side of device.

Next, referring to FIG. 5, description proceeds to characteristics of a relation between attenuating amount and frequencies in the SAW filter 11 of this embodiment. In such an SAW filter 11, an attenuating pole fp, an attenuating pole fs and an attenuating pole fLP appear in the frequency characteristics, as illustrated in FIG. 5. Herein, the attenuating pole fp is a resonant frequency by the second SAW resonators 21 while the attenuating pole fs is a resonant frequency by the first SAW resonators 20. Further, the attenuating pole fLP is determined by an electrostatic capacity of the first SAW resonators 20, an electrostatic capacity of the second SAW resonators 21, and an inductance component Lp.

Since the capacitance means 24 is located between the parallel arm 19 of the nearest position to the input terminal 15 and the parallel arm 19 of the nearest position to the output terminal 16 in this embodiment, the attenuating pole fLP can achieve a sufficient attenuating amount, as shown by a continuous line illustrated in FIG. 5. As a result, it becomes possible that attenuating amount at a frequency range outside the pass-band is largely increased without making an inductance component be small.

In addition, such capacitance means 24 can be readily formed. Consequently, sufficient attenuating amount at a frequency range outside the pass-band can be firmly obtained without designing the value of the inductance component Lp to be a very small value.

Besides, the above description was made about the SAW filter device 10 on which only one SAW filter 11 is mounted. The SAW filter of the present invention can be applied to various types of SAW filter devices. For example, two SAW filters 11 having center frequencies different from each other may be mounted on the SAW filter device to produce a branching filter. Further, the present invention is not restricted to a filter. The present invention can be applied to various SAW devices of the fields other than filters, on which one or a plurality of SAW elements are mounted.

As will be clearly understood from the above description, the following meritorious effects can be obtained according to this embodiment of the present invention. Since the capacitance means 24 is located between the parallel arm 19 of the nearest position to the input terminal 15 and the parallel arm 19 of the nearest position to the output terminal 16, it becomes possible that attenuating amount at a frequency range outside the pass-band is largely increased without making an inductance component be small. Further, such capacitance means 24 can be readily formed. Consequently, sufficient attenuating amount at a frequency range outside the pass-band can be firmly obtained without designing the value of the inductance component Lp to be a very small value.

Figure 33:
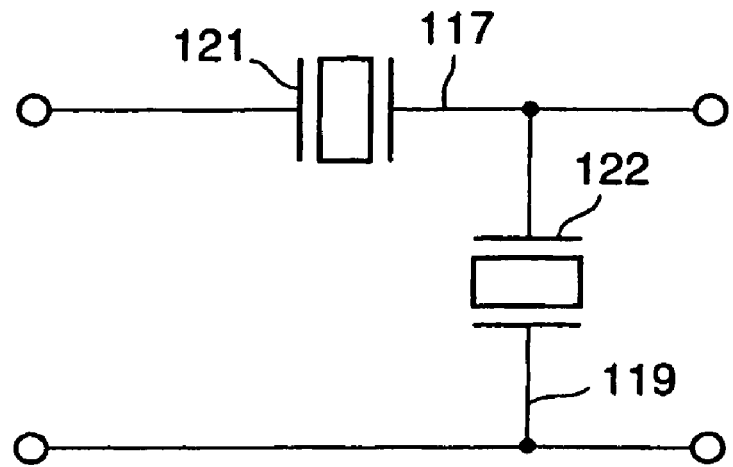
FIG. 33 is a circuit diagram for schematically showing an equal circuit of a fourth conventional SAW element.
Figure 34:
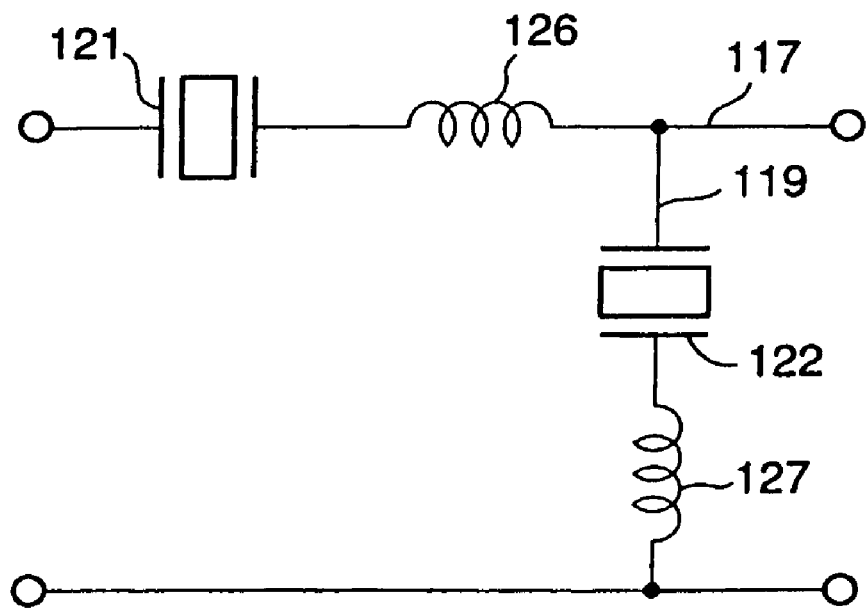
FIG. 34 is a circuit diagram for schematically showing an equal circuit of a fifth conventional SAW element.

Next, referring to FIG. 33, description is made about a fourth conventional SAW element in order to facilitate an understanding of the present invention. FIG. 33 shows a circuit diagram of the fourth conventional SAW element. For example, the following techniques are known as means for increasing attenuating amount at a frequency range outside the pass-band. The first technique is to make electrostatic capacity of an SAW resonator in a parallel arm be larger than that of an SAW resonator in a serial arm. Namely, when an electrostatic capacity of an SAW resonator 121 in a serial arm 117 is defined as Cs and that of an SAW resonator 122 in a parallel arm 119 is defined as Cp in FIG. 33, the first technique is to enlarge a value of Cp/Cs. The second technique is to insert an inductance 126 in a serial arm 117 or to insert an inductance 127 in a parallel arm 119 in FIG. 34, as disclosed in unexamined Japanese patent publication No.Hei 5-183380, namely 183380/1993.

Figure 35:
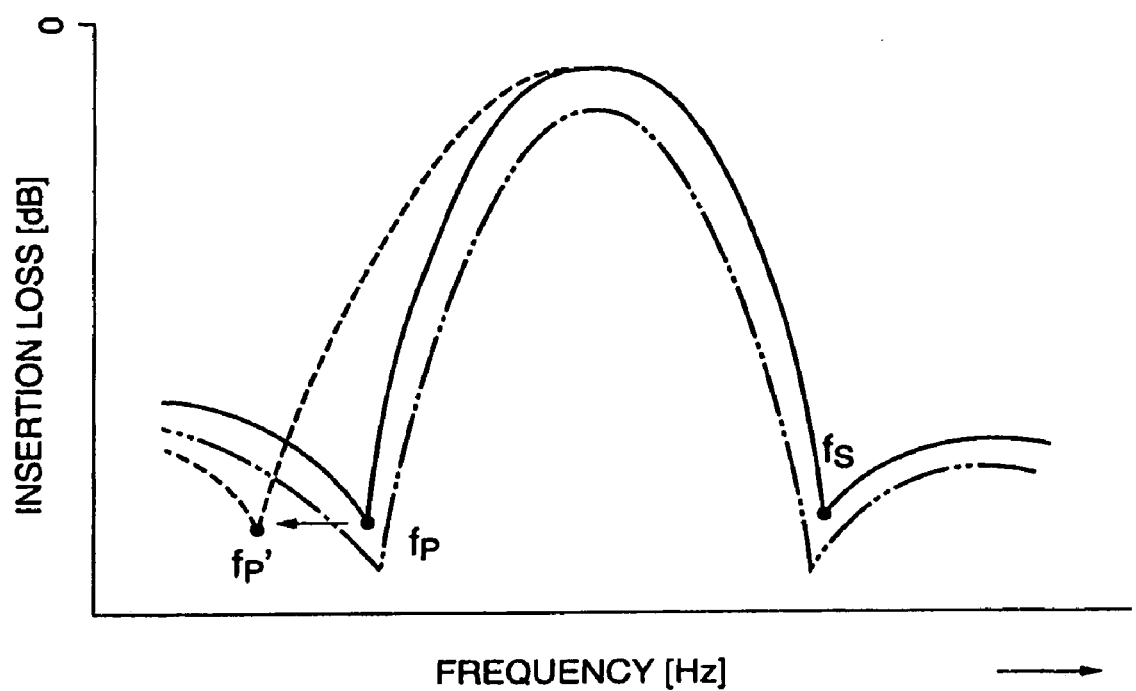
FIG. 35 is a graph for showing characteristics of relations between attenuation amounts and frequencies in the fourth and the fifth conventional SAW elements, respectively.

The first technique brings a problem that insertion loss is deteriorated. Namely, let the characteristic of a relation between attenuating amount and frequencies of an original SAW element be depicted by a continuous line in FIG. 35. When the value of Cp/Cs is enlarged, the attenuating amount is increased as shown by a two-dot chain line in FIG. 35 but the insertion loss is deteriorated simultaneously.

On the other hand, the second technique does not cause such a problem that insertion loss is deteriorated. By inserting an inductance in a serial arm or a parallel arm, the attenuating pole fp moves toward the lower frequency side to be the attenuating pole fp', as shown by a broken line in FIG. 35. As a result, the pass-band is enlarged to be broader. Particularly, attenuating amount is largely obtained at the frequency side lower than the pass-band.

However, when the SAW element is intended to have a higher performance by further enlarging attenuating amount at a frequency range outside the pass-band, characteristics of the SAW element obtained by the second technique cannot be satisfied. In order to solve the problems, embodiments of the present invention will be described below.

Figure 6:
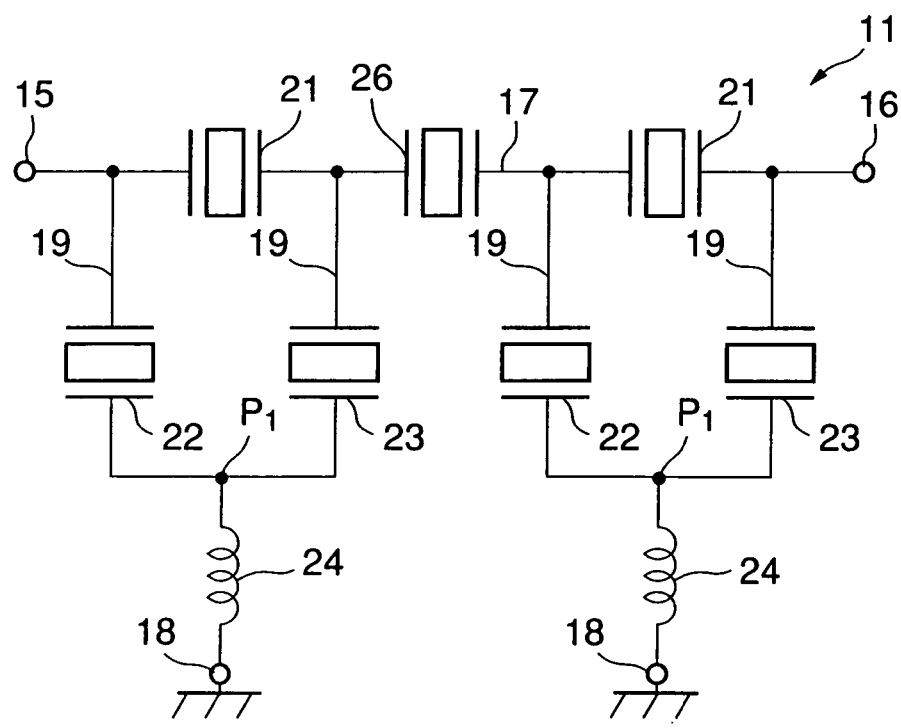
FIG. 6 is a circuit diagram for schematically showing an equal circuit of an SAW element according to a third embodiment of the present invention.
Figure 7:
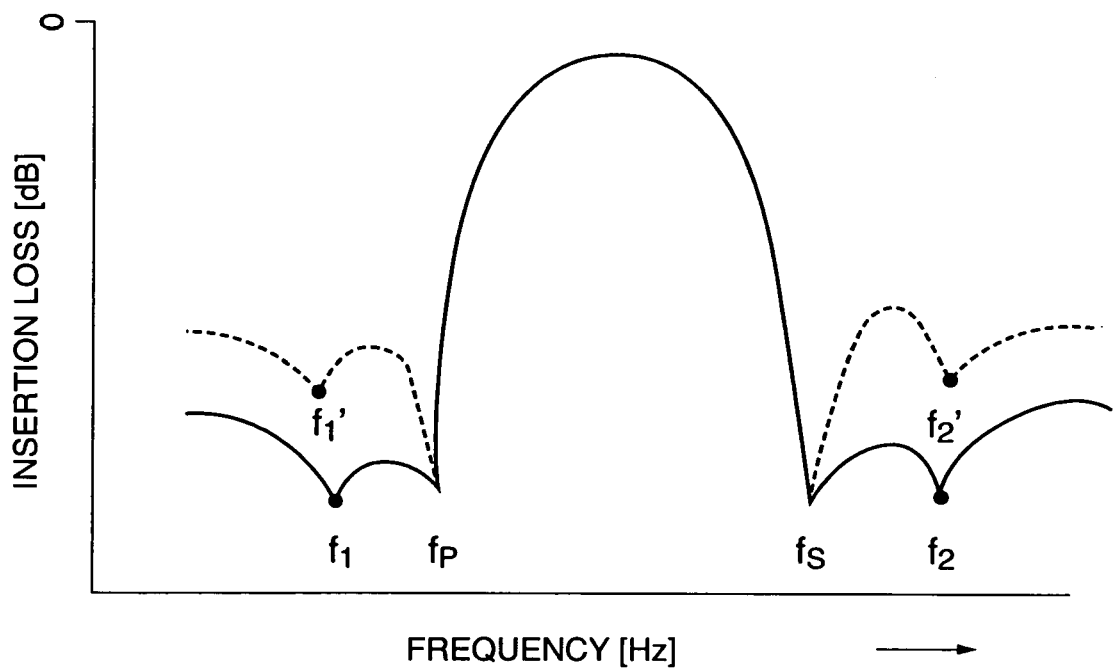
FIG. 7 is a graph for showing a characteristic of a relation between attenuation amounts and frequencies in the SAW element illustrated in FIG. 6.
Figure 8:
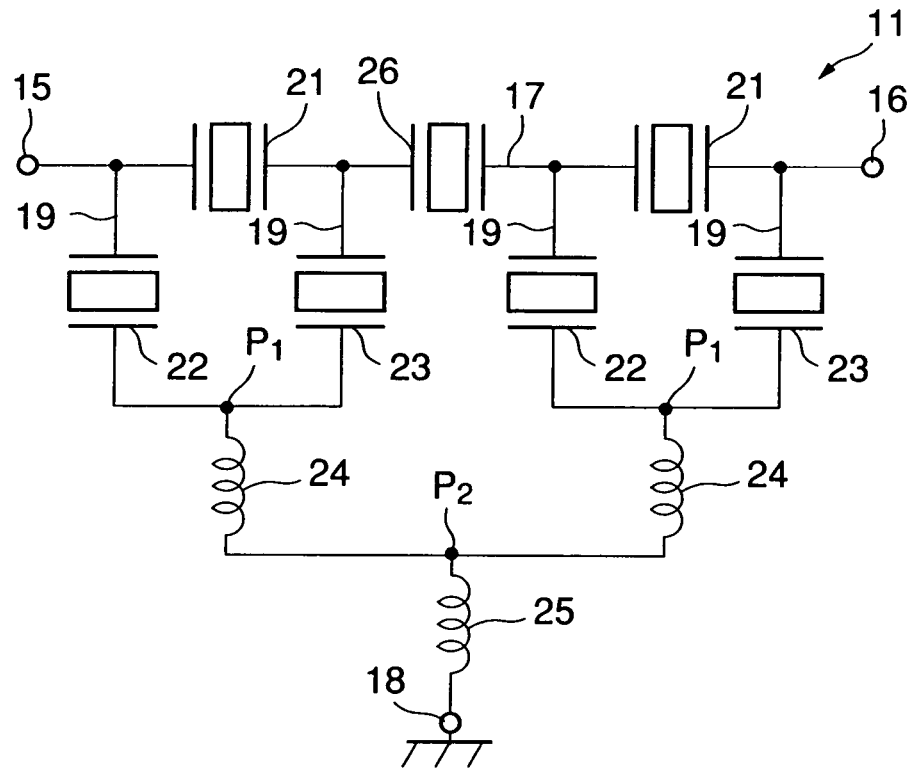
FIG. 8 is a circuit diagram for schematically showing an equal circuit of an SAW element according to a fourth embodiment of the present invention.
Figure 9:
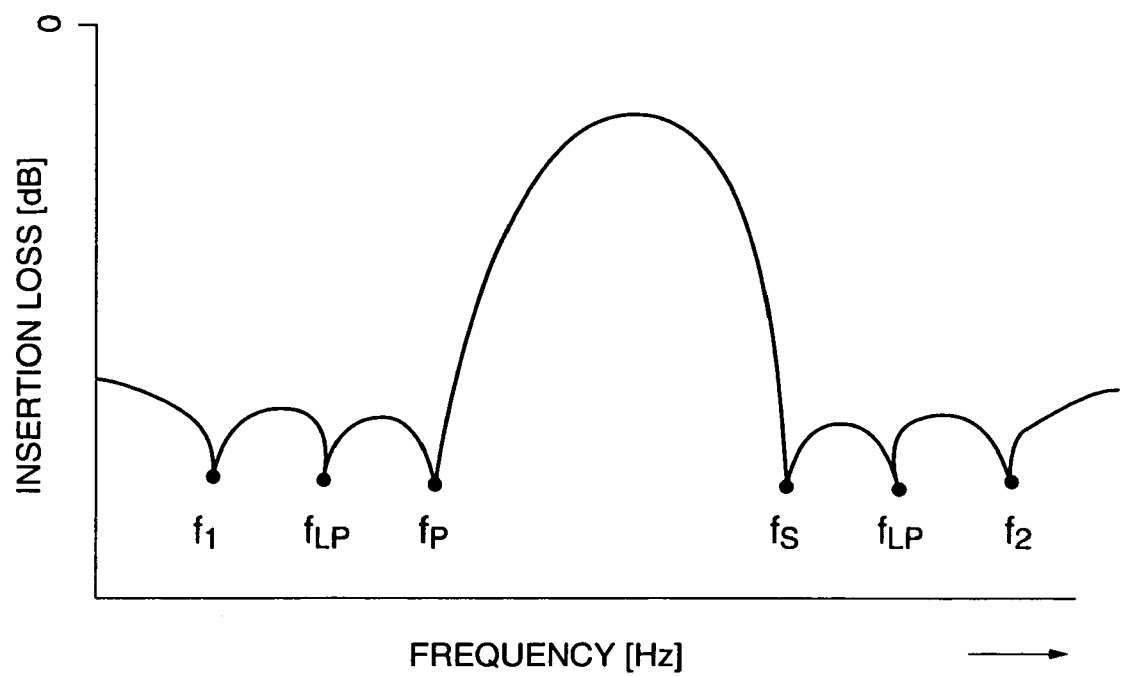
FIG. 9 is a graph for showing a characteristic of a relation between attenuation amounts and frequencies in the SAW element illustrated in FIG. 8.

Namely, referring to FIGS. 6 through 9, description will proceed to SAW elements according to third and fourth embodiments of the present invention. FIG. 6 is a circuit diagram for showing an equal circuit of the SAW element according to the third embodiment of the present invention. FIG. 7 is a graph for showing a characteristic of a relation between attenuating amount and frequencies in the SAW element illustrated in FIG. 6. FIG. 8 is a circuit diagram for showing an equal circuit of the SAW element according to the fourth embodiment of the present invention. FIG. 9 is a graph for showing a characteristic of a relation between attenuating amount and frequencies in the SAW element illustrated in FIG. 8.

As illustrated in FIG. 6, in the SAW element 11 according to the third embodiment, a serial arm (first wiring portion) 17 is formed between an input terminal 15 and an output terminal 16. Further, a plurality of (four) parallel arms (second wiring portions) 19 are connected between the serial arm 17 and reference potential terminals 18. Accordingly, a ladder-type circuit is constituted by the serial arm 17 and the parallel arms 19.

In the serial arm 17, two first SAW resonators 21 which have a predetermined resonant frequency and the anti-resonant frequency are located in serial to each other. Further, a fourth SAW resonator 26 is located between the two first SAW resonators 21 adjacent to each other. Further, the parallel arms 19 are formed between an input terminal 15 and the first SAW resonator 21 of the nearest position to the input terminal 15, between an output terminal 16 and the first SAW resonator 21 of the nearest position to the output terminal 16, and between the first SAW resonators 21 adjacent to each other, respectively, with corresponding to respective first SAW resonators 21. Besides, the parallel arms 19 are corresponding to the respective first SAW resonators 21, so that two parallel arms 19 are formed between the first SAW resonators 21 adjacent to each other, as illustrated in FIG. 6.

Further, second SAW resonators 22 are located in the parallel arms 19 each of which is positioned at the side of the input terminal 15 with respect to the respective first SAW resonators 21. On the other hand, third SAW resonators 23 are located in the parallel arms 19 each of which is positioned at the side of the output terminal 16 with respect to the respective first SAW resonators 21. Each of these second and third SAW resonators 22 and 23 has an anti-resonant frequency corresponding with the resonant frequency of each of the first SAW resonators 21. Herein, "anti-resonant frequency corresponding with the resonant frequency of each of the first SAW resonators 21" in this specification does not require that the both frequencies are strictly corresponding with each other. It is enough that the both frequencies are corresponding with each other to perform a predetermined function, such as a function of a filter, and the like. Further, first inductance elements 24 are located between the respective reference potential terminals 18 and connection points P1 for connecting the second and third SAW resonators 22 and 23 each other at the side of the respective reference potential terminals 18, respectively.

With the structure being illustrated, a single unit element in this specification is composed of one first SAW resonator 21, one second SAW resonator 22 located in the parallel arm 19 at the side of the input terminal 15 of the first SAW resonator 21, one third SAW resonator 23 located in the parallel arm 19 at the side of the output terminal 16 of the first SAW resonator 21, and one first inductance element 24 located between one reference potential terminal 18 and one connection point P1. Therefore, two single unit elements are formed in the SAW element illustrated in FIG. 6. Further, resonant frequencies of the respective single unit elements are corresponding to each other. However, it is enough in this embodiment of the present invention that at least two single unit elements are formed in the SAW element. Namely, more than two single unit elements can be formed in the SAW element. In addition, it is not necessary that resonant frequencies of the respective single unit elements are corresponding to each other.

Next, referring to FIG. 7, description proceeds to characteristics of a relation between attenuating amount and frequencies in the SAW element 11 of this embodiment. Herein, it is assumed that only one single unit element is formed in the SAW element 11. In such an SAW element 11, an attenuating pole fp, an attenuating pole fs, an attenuating pole f1, and an attenuating pole f2 appear in the frequency characteristics, as illustrated in FIG. 7. Herein, the attenuating pole fp is a resonant frequency by the second SAW resonator 22 and the third SAW resonator 23. The attenuating pole fs is a resonant frequency by the first SAW resonator 21. Further, the attenuating pole f1 and the attenuating pole f2 are not formed by resonance of the first, the second and the third SAW resonators 21, 22, and 23 but are determined by an electrostatic capacity of the first SAW resonator 21, an electrostatic capacity of the second SAW resonator 22, and the first inductance element 24. Since the first inductance element 24 has a predetermined resistance value, the attenuating pole f1 and the attenuating pole f2 cannot achieve sufficient attenuating amount in the single unit element. As a result, only the characteristics shown by a broken line of FIG. 7 can be obtained in frequency ranges except the near range to the pass-band.

Herein, according to the SAW element 11 of this embodiment, a plurality of (two) first inductance elements 24 are connected in parallel to each other. If numbers of single unit elements connected in parallel to each other are defined as N, a resistance value of the first inductance elements 24 as a whole of the circuit can be reduced down to 1/N. In other words, Q of an inductance can be N times as large as an original value of the Q. The attenuating pole f1 and the attenuating pole f2 can thereby achieve sufficient attenuating amount, as shown by a continuous line of FIG. 7.

In other words, sufficient attenuating amount can be given to the attenuating pole f1 and the attenuating pole f2 by multiplying a plurality of stages of attenuating pole by a single unit element not due to acoustic resonance phenomenon. Accordingly, in the SAW element 11 of this embodiment, it becomes possible to drastically enlarge attenuating amount at a frequency range outside the pass-band without increasing insertion loss.

Herein, as illustrated in FIG. 8, the sides of the reference potential terminal 18 of the respective first inductance elements 24 in respective single unit elements may be connected to each other to produce a connection point P2. Further, a second inductance element 25 then may be located between the connection point P2 and the reference potential terminal 18. As a result, as shown in FIG. 9, an attenuating pole fLP appears in the frequency characteristics by the second inductance element 25. Further, attenuating amount at a frequency range outside the pass-band can be enlarged by the attenuating pole fLP. Accordingly, even if a value of inductance of the first inductance elements 24 is small, sufficient attenuating amount can be obtained.

It is sometimes difficult in fabrication of a circuit to make the first inductance elements 24 have a sufficiently large value of inductance. Therefore, the fabrication of a circuit becomes easy by inserting such a second inductance element 25. It thereby becomes possible to improve packaging ability or packaging density. Besides, in the above embodiment, two first SAW resonators 21 are located in the serial arm 17. One second SAW resonator 22 and one third SAW resonator 23 are located in the respective parallel arms 19 corresponding with each first SAW resonator 21 (See FIGS. 6 and 8). Alternatively, not fewer than three first SAW resonators 21 may be located in serial, so that second SAW resonators 22 and third SAW resonators 23 may be located in the respective parallel arms 19 corresponding with these first SAW resonators 21, respectively.

The above-mentioned meritorious effect can be obtained also in the constitution of this embodiment, namely, it becomes possible also in the constitution of this embodiment to drastically enlarge attenuating amount at a frequency range outside the pass-band without increasing insertion loss. Therefore, in view of the point of making a surface area of the SAW element 11 be small to produce a smaller device, it is desirable to use a layout of this embodiment illustrated in FIGS. 6 and 8. Namely, it is desirable to use the layout in which two first SAW resonators 21, two second SAW resonators 22 and two third SAW resonators 23 are used, respectively, that is such a layout in which two single unit elements are formed in the SAW element 11. Further, the present invention was applied to a ladder-type circuit in the above embodiment. However, the present invention is not restricted to such a ladder-type circuit.

Moreover, the above-mentioned meritorious effect can be obtained also in the case that, like this embodiment, the fourth SAW resonator 26 is located between the two first SAW resonators 21 adjacent to each other in order to increase numbers of stages of filters. Further, the above-mentioned meritorious effect can be obtained also in a case that a capacitance element is connected between the two first SAW resonators 21 adjacent to each other in order to adjust resonant frequency of the single unit element. Besides, the fourth SAW resonator 26 and the capacitance element may be alternatively located between the input terminal 15 and the first SAW resonator 21 or between the output terminal 16 and the first SAW resonator 21. The fourth SAW resonator 26 and the capacitance element may be located in any one of the positions not only between the input terminal 15 and the first SAW resonator 21 but also between the output terminal 16 and the first SAW resonator 21.

Besides, the above description was made about the SAW device on which only one SAW filter 11 is mounted. The SAW filter of the present invention can be applied to various types of SAW devices. For example, two SAW elements 11 having center frequencies different from each other may be mounted on the SAW device to produce a branching filter. Further, the present invention is not restricted to a filter. The present invention can be applied to various SAW devices of the fields other than filters, on which one or a plurality of SAW elements are mounted. Besides, when the present invention is applied to the branching filter, the SAW element 11 of this embodiment mentioned above can be used as one of the two SAW elements mounted on the SAW device.

As will be clearly understood from the above description, the following meritorious effects can be obtained according to this embodiment of the present invention. Namely, the attenuating pole by a plurality of first inductance elements can achieve a sufficient attenuating amount in this embodiment. It therefore becomes possible to drastically enlarge the attenuating amount at a frequency range outside the pass-band without increasing insertion loss. In addition, it is possible to enlarge an attenuating amount at a frequency range outside the pass-band by inserting the second inductance element. As a result, even if a value of inductance of the first inductance elements is small, a sufficient attenuating amount can be obtained. Accordingly, it becomes possible to improve packaging ability or packaging density.

Figure 36:
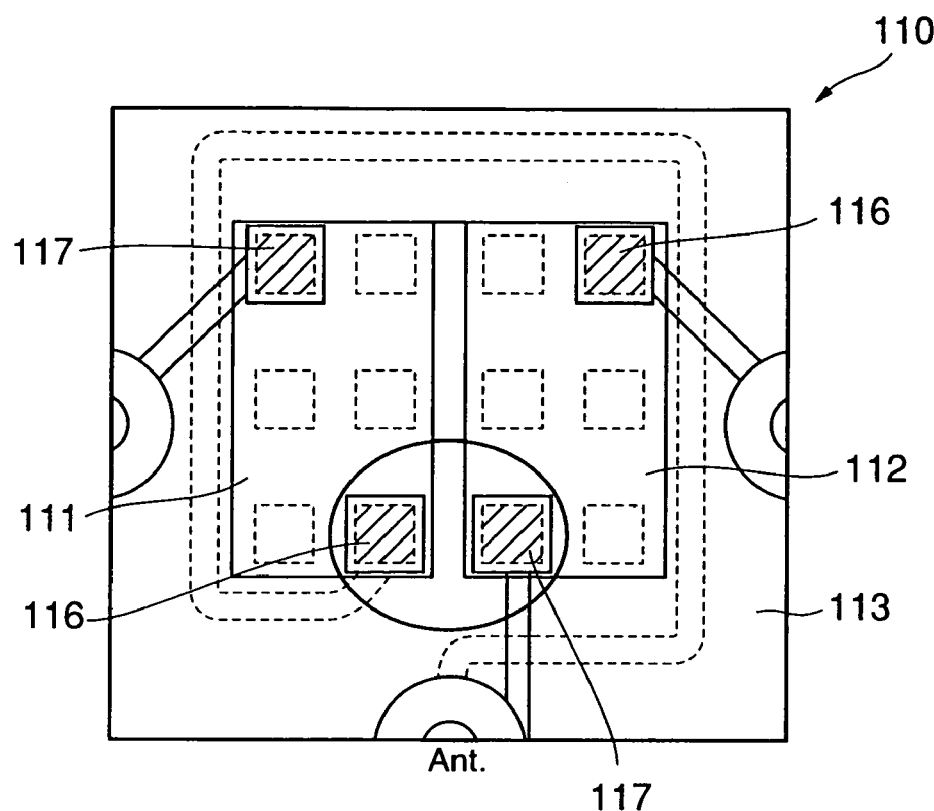
FIG. 36 is a plan view for schematically showing a mounting substrate of an SAW device as a comparative example, in which the reception and the transmission filters are mounted.
Figure 37:
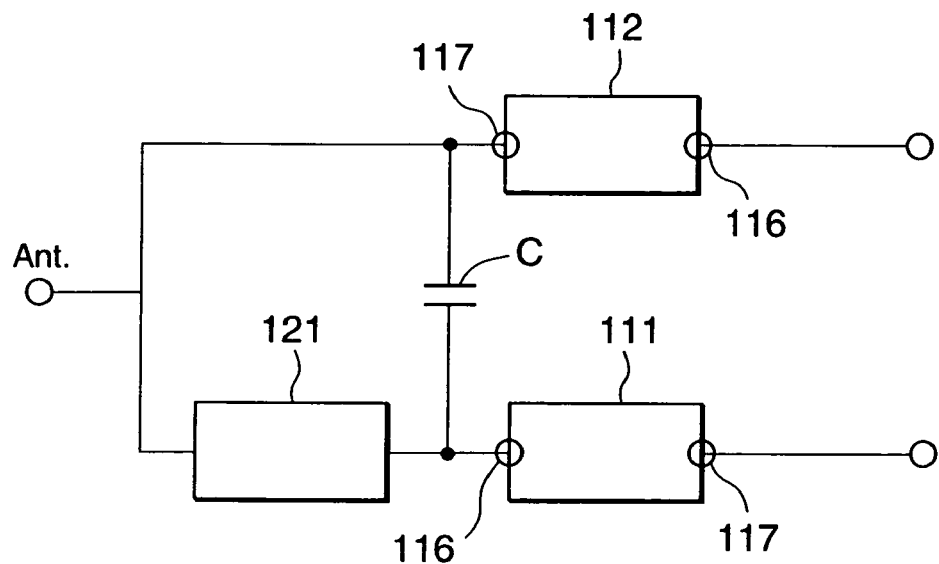
FIG. 37 is a block diagram for schematically showing a constitution illustrated in FIG. 36.

Next, referring to FIGS. 36 and 37, description is made about a fifth conventional SAW element in order to facilitate an understanding of the present invention. FIG. 36 shows a mounting substrate 113 of an SAW device 110 as a comparative example, in which the reception and the transmission filters 111 and 112 are mounted. FIG. 37 shows a block diagram of the constitution illustrated in FIG. 36. In the example illustrated in FIG. 36, an input terminal 116 of the reception filter 111 and an output terminal 117 of the transmission filter 112 adjacent to the reception filter 111 are positioned closely to each other. Thus, when the input and output terminals 116, 117 of the both filters 111, 112 are close to each other, a parasitic capacitance C is generated to produce a coupling between the input and the output terminals 116 and 117, as if a capacitance element is located therebetween.

Figure 12:
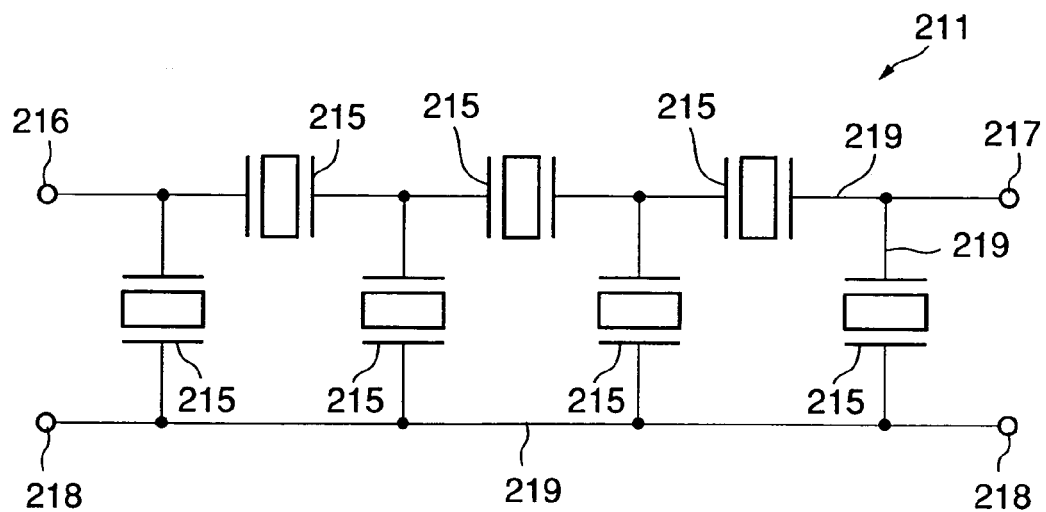
FIG. 12 is a schematic view for showing a conductor pattern formed in a reception filter of the SAW device illustrated in FIG. 10.
Figure 13:
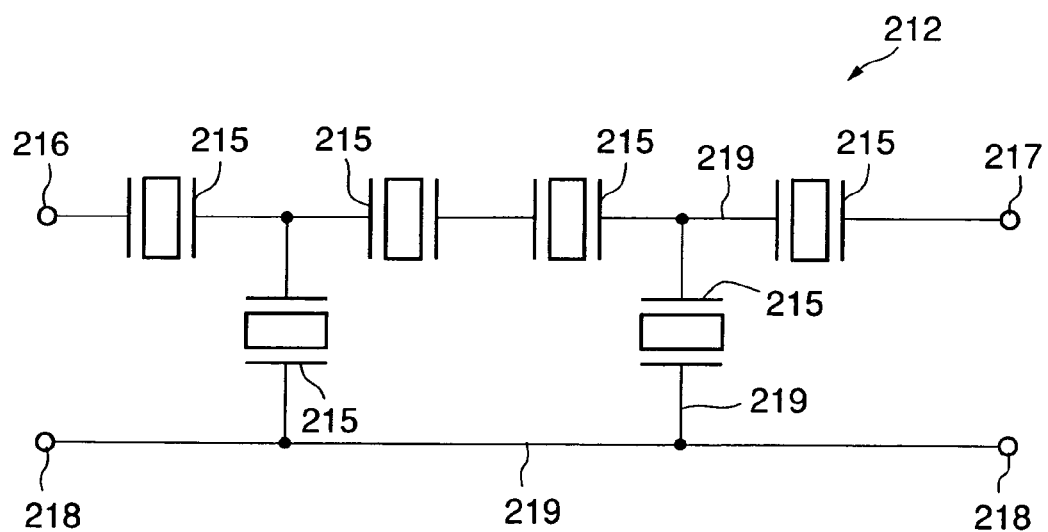
FIG. 13 is a schematic view for showing a conductor pattern formed in a transmission filter of the SAW device illustrated in FIG. 10.

Accordingly, frequency characteristics as an SAW duplexer, concretely, insertion loss, attenuating amount, and isolation are deteriorated. Namely, when a reception filter having a pattern illustrated in FIG. 12 and a transmission filter having a pattern illustrated in FIG. 13 are connected as a duplexer, the frequency characteristics thereof are deteriorated as shown by a broken line of FIG. 11 due to an influence of the coupling.

Figure 10:
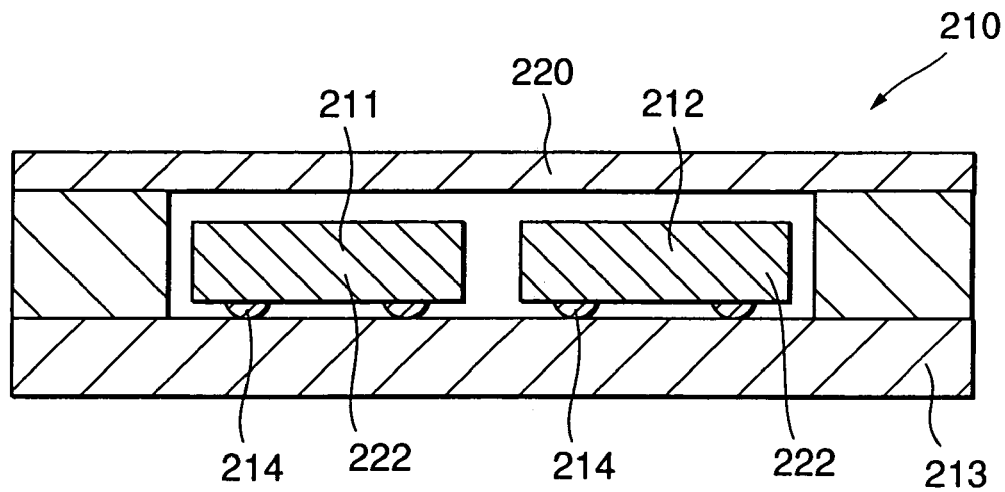
FIG. 10 is a sectional view for schematically showing an SAW device according to a fifth embodiment of the present invention.
Figure 11:
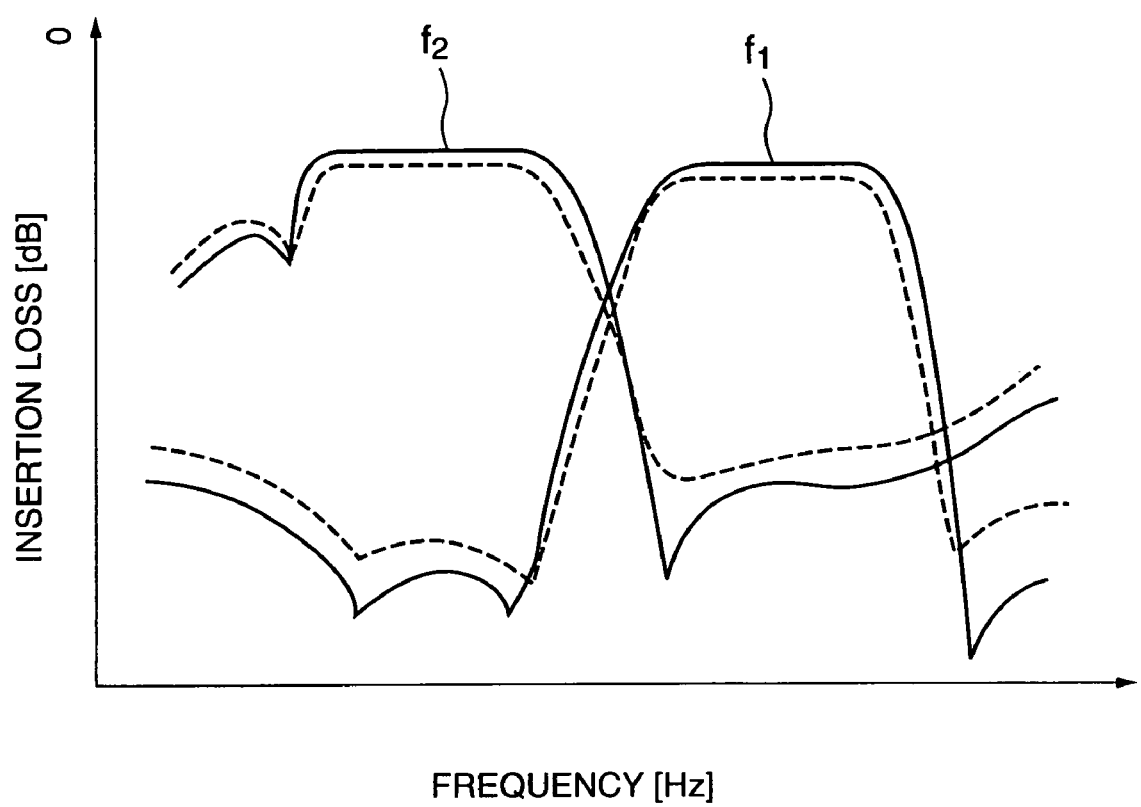
FIG. 11 is a graph for showing a frequency characteristic of the SAW device illustrated in FIG. 10.
Figure 14:
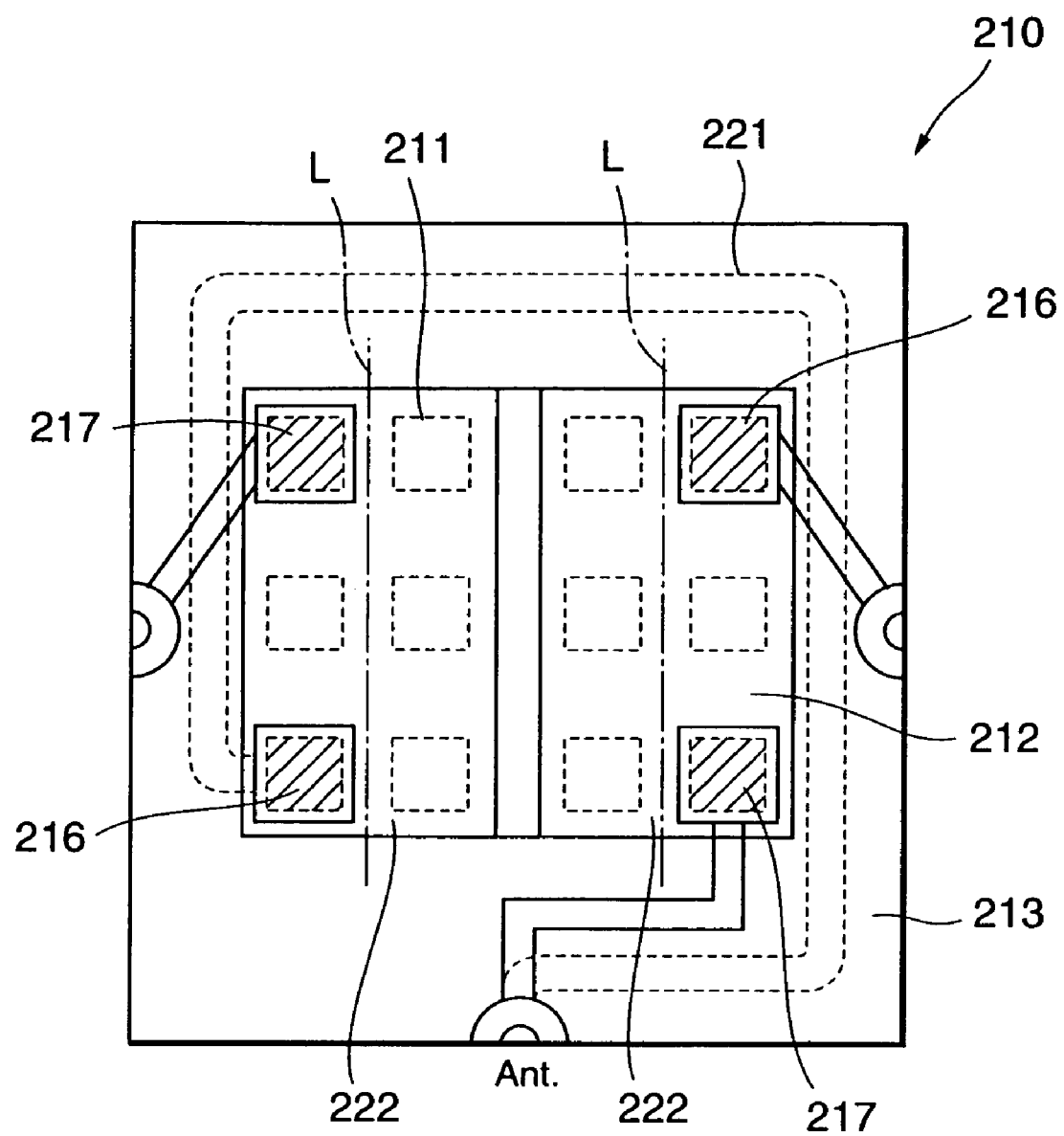
FIG. 14 is a plan view for schematically showing a mounting substrate of the SAW device illustrated in FIG. 10, in which the reception and the transmission filters are mounted.
Figure 15:
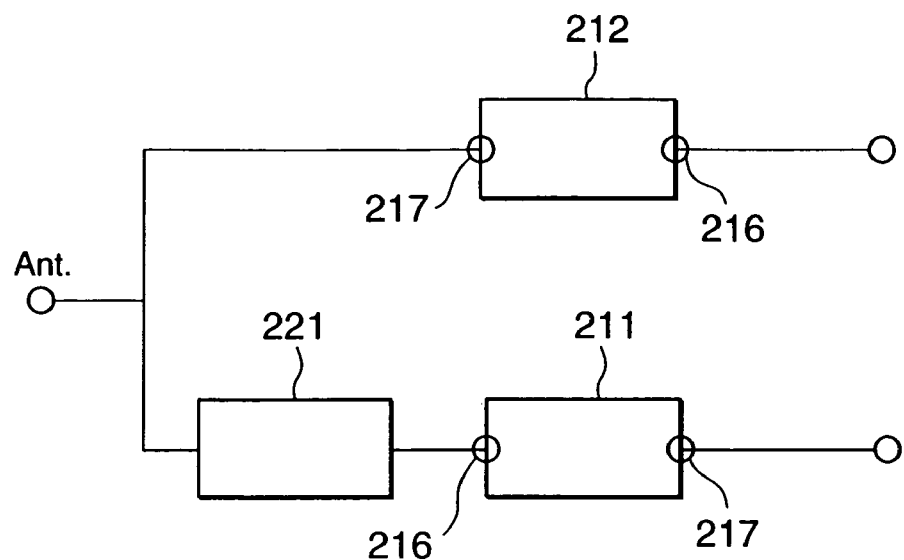
FIG. 15 is a block diagram for schematically showing a constitution illustrated in FIG. 14.
Figure 16:
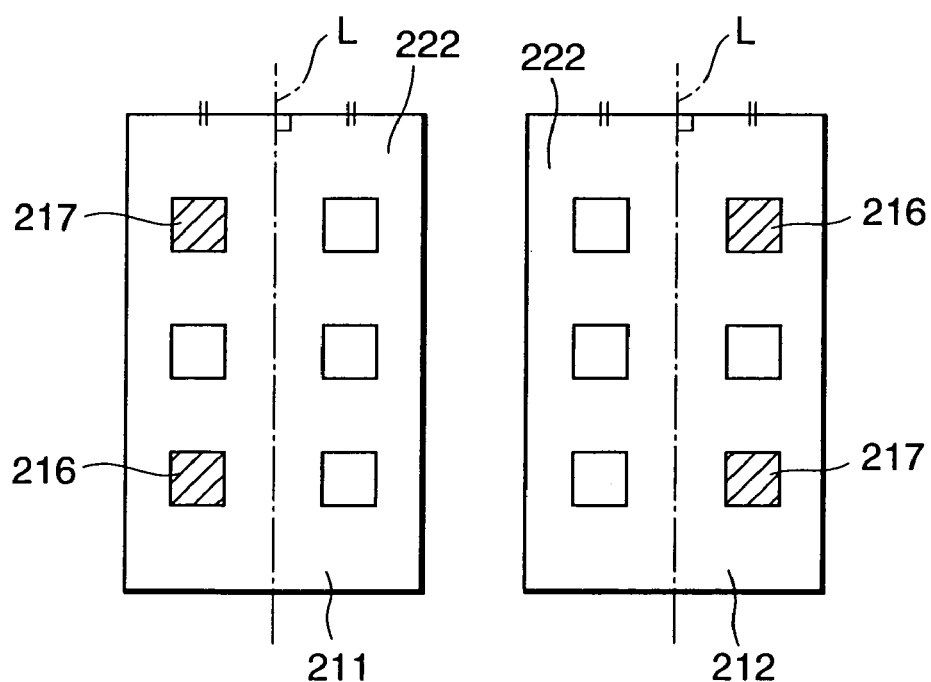
FIG. 16 is an explanation view for schematically showing an example of location of electrodes of the reception and the transmission filters in the SAW device illustrated in FIG. 10.
Figure 17:
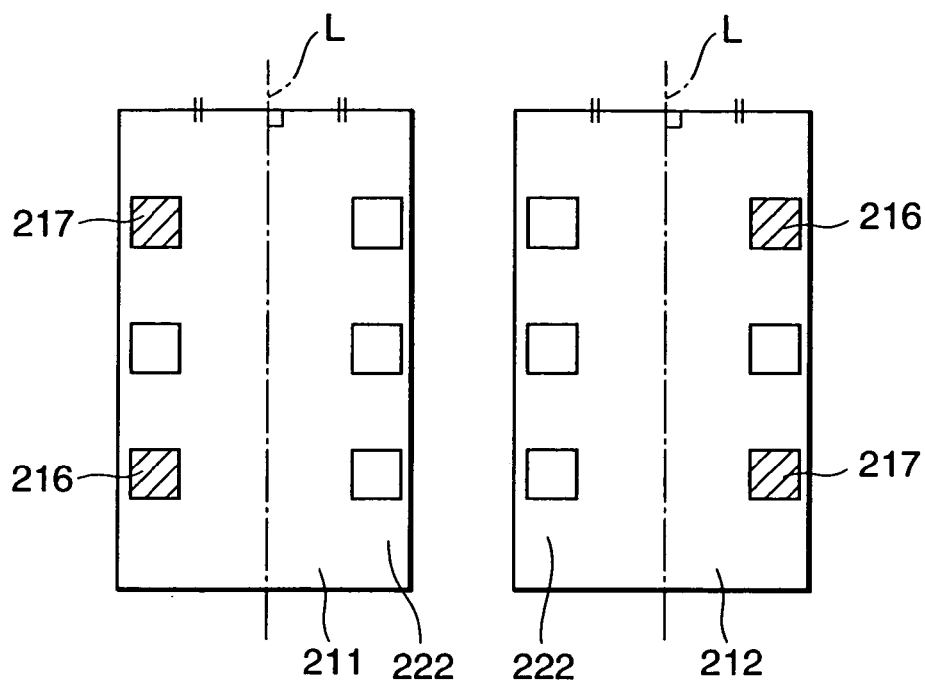
FIG. 17 is an explanation view for schematically showing another example of location of electrodes of the reception and the transmission filters in the SAW device illustrated in FIG. 10.
Figure 18:
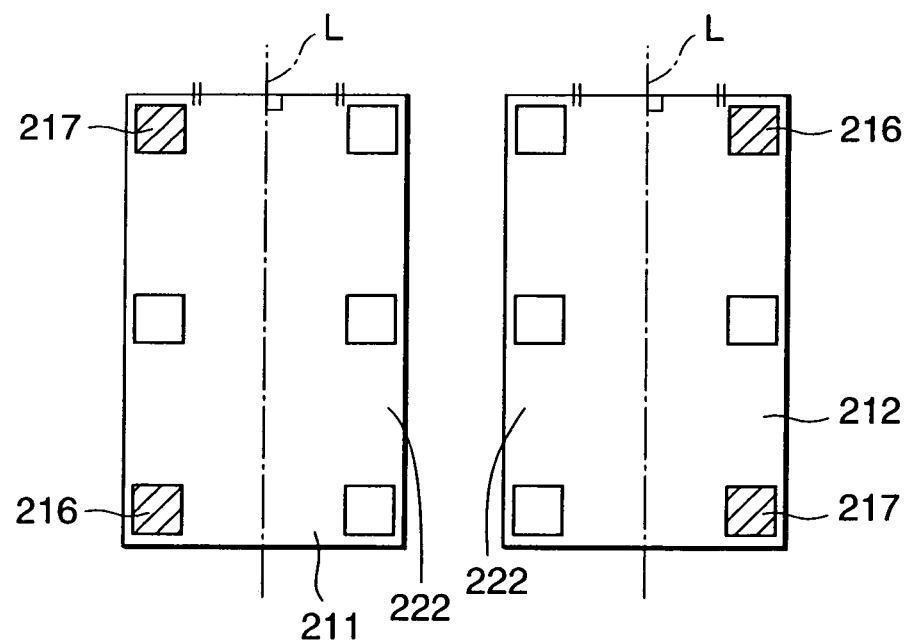
FIG. 18 is an explanation view for schematically showing further another example of location of electrodes of the reception and the transmission filters in the SAW device illustrated in FIG. 10.

In order to solve the problem, the following embodiment of the present invention is provided. FIG. 10 is a sectional view for showing an SAW device according to a fifth embodiment of the present invention. FIG. 11 is a graph for showing a frequency characteristic of the SAW device illustrated in FIG. 10. FIG. 12 is a schematic view for showing a conductor pattern formed in a reception filter of the SAW device illustrated in FIG. 10. FIG. 13 is a schematic view for showing a conductor pattern formed in a transmission filter of the SAW device illustrated in FIG. 10. FIG. 14 is a plan view for showing a mounting substrate of the SAW device illustrated in FIG. 10, in which the reception and the transmission filters are mounted. FIG. 15 is a block diagram for showing a constitution illustrated in FIG. 14. FIG. 16 is an explanation view for showing an example of location of electrodes of the reception and the transmission filters in the SAW device illustrated in FIG. 10. FIG. 17 is an explanation view for showing another example of location of electrodes of the reception and the transmission filters in the SAW device illustrated in FIG. 10. FIG. 18 is an explanation view for showing further another example of location of electrodes of the reception and the transmission filters in the SAW device illustrated in FIG. 10.

The SAW device 210 illustrated in FIG. 10 comprises a reception filter (first SAW element) 211 and a transmission filter (second SAW element) 212 which have center frequencies f1, f2 different from each other, as shown by a continuous line of FIG. 11, a mounting substrate 213 which is made of ceramics (for example, alumina, and the like) or resin (for example, FR-4, and the like) and on which a predetermined conductor patterns are formed, and bumps 214, such as Au, solder, or the like. The SAW device 210 is an SAW duplexer in which the reception filter (first SAW element) 211 and the transmission filter (second SAW element) 212 are mounted on the mounting substrate 213 by a flip-chip mounting through the bumps 214.

As illustrated in FIG. 10, the reception filter 211 and the transmission filter 212 each of which is an SAW element have structures in which SAW resonators, and the like are formed on piezo-electric substrates 222, respectively. Herein, FIG. 12 shows a conductor pattern formed in the reception filter 211 while FIG. 13 shows a conductor pattern formed in the transmission filter 212. As illustrated in FIGS. 12 and 13, SAW resonators 215 which are resonant with a surface acoustic wave having a predetermined frequency are formed in the reception filter 211 and the transmission filter 212. As illustrated in FIGS. 12 and 13, an input terminal 216 and an output terminal 217 which electrically connect the SAW resonators 215 with the mounting substrate 213 and through which an electric signal to the SAW resonators 215 is inputted or outputted, and ground electrodes 218 are electrically connected to the SAW resonators 215 through wirings 219 in the reception filter 211 and the transmission filter 212, respectively. Besides, each of the SAW resonators 215 has a pair of exciting electrode portions each of which has a shape of the teeth of a comb with being involved in each other. With the structure, by applying voltage on the SAW resonator 215 of the input side to be subjected to an electric field, a surface acoustic wave (SAW) is produced on the piezo-electric substrate 222 by piezo-electric effects. On the other hand, mechanical strain due to thus produced surface acoustic wave (SAW) generates an electric field to be converted into an electric signal by the exciting electrode portions in the SAW resonator 215 of the output side.

In the examples illustrated in FIGS. 12 and 13, the wiring 219 between the input terminal 216 and the output terminal 217 is formed to be a serial arm. Further, a plurality of parallel arms that are the wirings 219 are formed between the serial arm and the ground electrodes 218. Accordingly, the SAW resonators 215 are located in the serial arm and the parallel arms to constitute a ladder-type circuit. The other constitutions of a circuit can be used. The piezo-electric substrate 222 is formed by a piezo-electric single crystal, such as LiNbO3, LiTaO3, crystal, and the like, or formed by piezo-electric ceramics, such as lead titanate zirconate piezo-electric ceramics. Alternatively, an insulating substrate on which a piezo-electric thin film, such as a ZnO thin film, and the like is formed may be used as the piezo-electric substrate 222.

The reception filter 211 and the transmission filter 212 are hermetic sealed by the cap 220. The reception filter 211 and the transmission filter 212 are thereby protected from dust, mechanical impact, and the like. FIG. 14 shows the mounting substrate 213 on which the reception and the transmission filters 211 and 212 are mounted. FIG. 15 shows a block diagram of the constitution illustrated in FIG. 14. As illustrated in FIG. 14, the input terminals 216, the output terminals 217 and the ground electrodes 218 are formed in the reception filter 211 and the transmission filter 212. On the other hand, a branching line 221 for branching a signal is formed on the mounting substrate 213. Further, as illustrated in FIG. 15, the branching line 221 is electrically located between an antenna and the input terminal 216 of the reception filter 211. The antenna and the output terminal 217 of the transmission filter 212 are electrically connected to each other.

Thus, as will be shown in detail in FIG. 16, the input terminal 216 and the output terminal 217 are formed at any one of the sides (left side in the illustrated example) with respect to a central axis L of the piezo-electric substrate 222 in the reception filter 211. On the other hand, in the transmission filter 212, the input terminal 216 and the output terminal 217 are formed one side separate (apart) from the reception filter 211 (right side in the illustrated example) with respect to a central axis L of the piezo-electric substrate 222 that is in parallel to the central axis L of the piezo-electric substrate 222 at the side of the reception filter 211. Besides, "central axis L of the piezo-electric substrate 222" in this specification is a vertical line against any one of the four arms of the rectangular piezo-electric substrate 222.

As illustrated in FIG. 14, in response to the above, pads are formed on a surface layer of the mounting substrate 213 in correspondence to the pads of the input and the output terminals 216 and 217 of the reception and the transmission filters 211 and 212. Accordingly, the input terminals 216 and the output terminals 217 formed in the reception filter 211 and the transmission filter 212, respectively are located separately from each other. It becomes possible to reduce a coupling generated between both the reception and the transmission filters 211 and 212. As a result, frequency characteristics of the SAW device 210 can be prevented from being deteriorated to a minimum extent. Further, the SAW device 210 can be fabricated smaller in size by improving packaging density of the SAW element.

Besides, it is enough that the input terminal 216 and the output terminal 217 are formed within an area of one of the sides with respect to the central axis L of the piezo-electric substrate 222. In order to make a distance between the input terminals 216 and the output terminals 217 in the reception and the transmission filters 211 and 212 be more separate to further reduce the coupling, it is desirable that, for example, as illustrated in FIG. 17, the input terminals 216 and the output terminals 217 are formed near the side surface of the piezo-electric substrate 222 that is in parallel to the central axis L. Alternatively, it is also desirable that, as illustrated in FIG. 18, the input terminals 216 and the output terminals 217 are formed at the corner portions of the piezo-electric substrate 222 different from each other, respectively.

In the above description, the reception filter 211 that is a first SAW element and the transmission filter 212 that is a second SAW element are mounted on the mounting substrate 213 with being separated from each other. However, both the reception filter 211 and the transmission filter 212 may be formed in a body. Further, in the above description, one reception filter 211 that is a first SAW element and one transmission filter 212 that is a second SAW element are mounted, respectively. A plurality of reception filters 211 and a plurality of transmission filters 212 may be mounted, respectively.

Further, in this embodiment, the mounting substrate 213 is composed of a single layer. However, the mounting substrate 213 may be composed of two or more layers. The reception filter 211 and the transmission filter 212 may be electrically connected to the mounting substrate 213 through wires. The SAW device of this embodiment of the present invention is not restricted to an SAW duplexer. Therefore, the first SAW element and the second SAW element are not restricted to the reception filter 211 and the transmission filter 212, respectively. In other words, the present invention can be applied to various SAW devices on which an SAW element is mounted.

As will be clearly understood from the above description, the following meritorious effects can be obtained according to this embodiment of the present invention. Namely, the input terminals 216 and the output terminals 217 formed in the reception filter 211 and the transmission filter 212, respectively are located separately from each other. It becomes possible to reduce a coupling generated between both the reception and the transmission filters 211 and 212. As a result, frequency characteristics of the SAW device 210 can be prevented from being deteriorated to a minimum extent. Further, the SAW device 210 can be fabricated smaller in size by improving packaging density of the SAW element.

Figure 19:
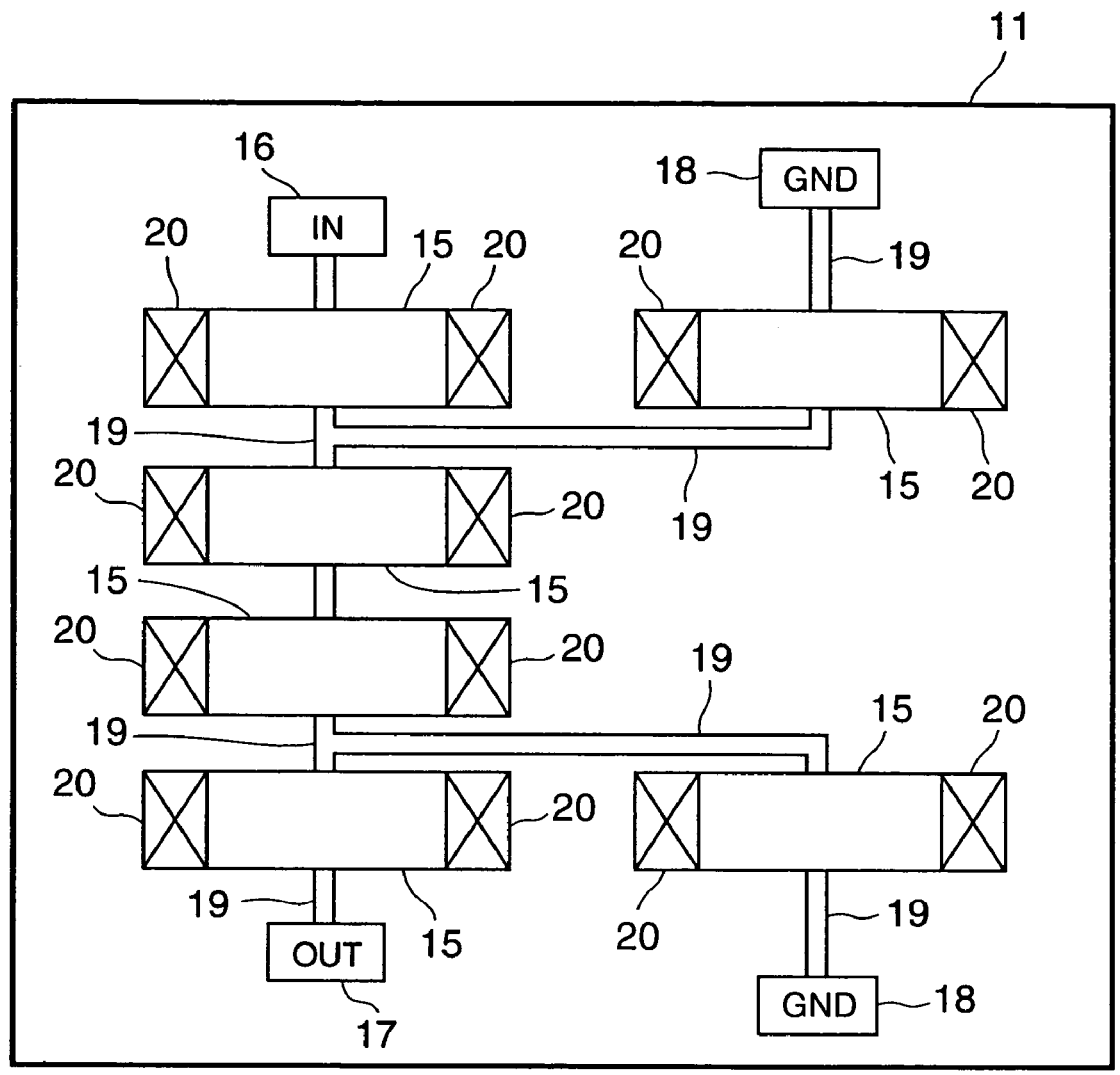
FIG. 19 is a schematic view for showing a circuit of an SAW element according to a sixth embodiment of the present invention.
Figure 20:
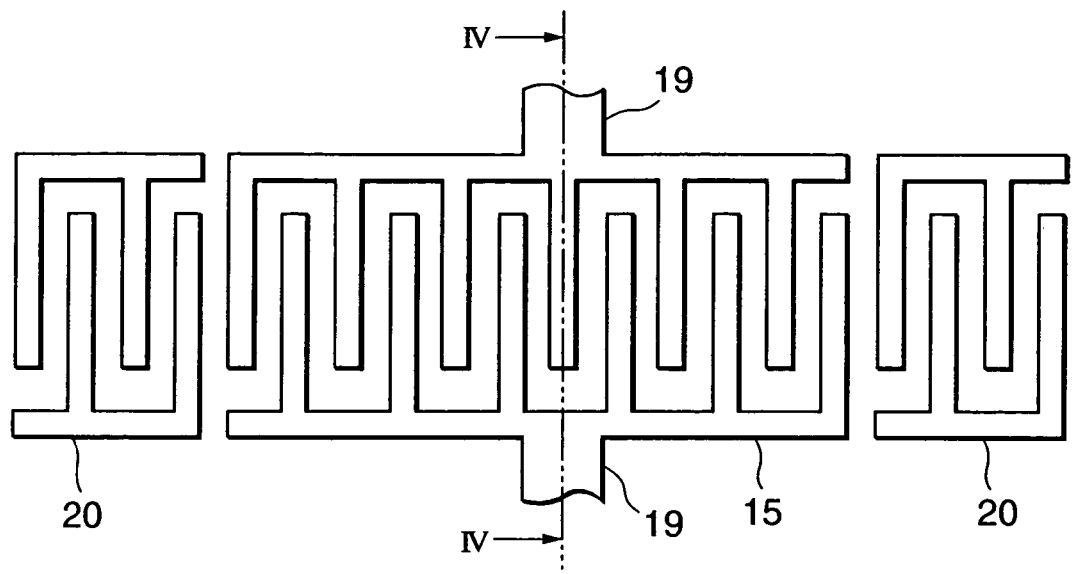
FIG. 20 is a plan view for schematically showing a feature portion in the SAW element illustrated in FIG. 19.
Figure 21:
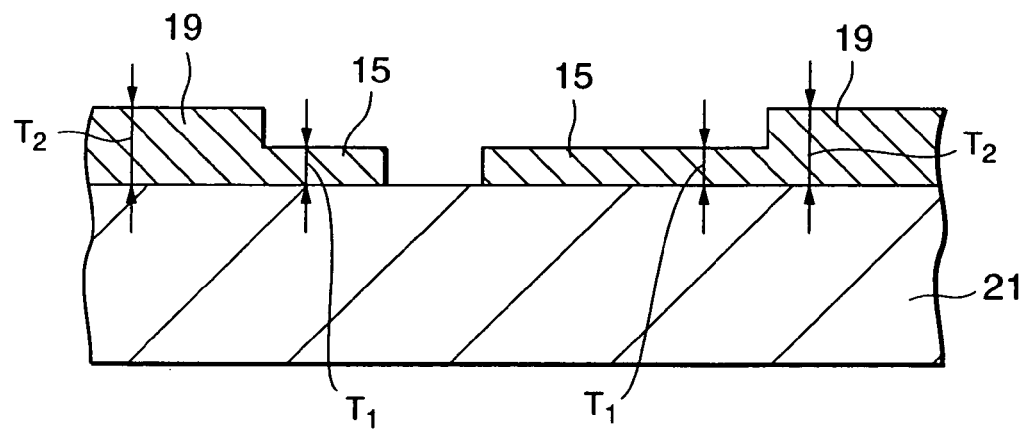
FIG. 21 is a sectional view for schematically showing the feature portion in the SAW element taken along —line of FIG. 20.
Figure 22:
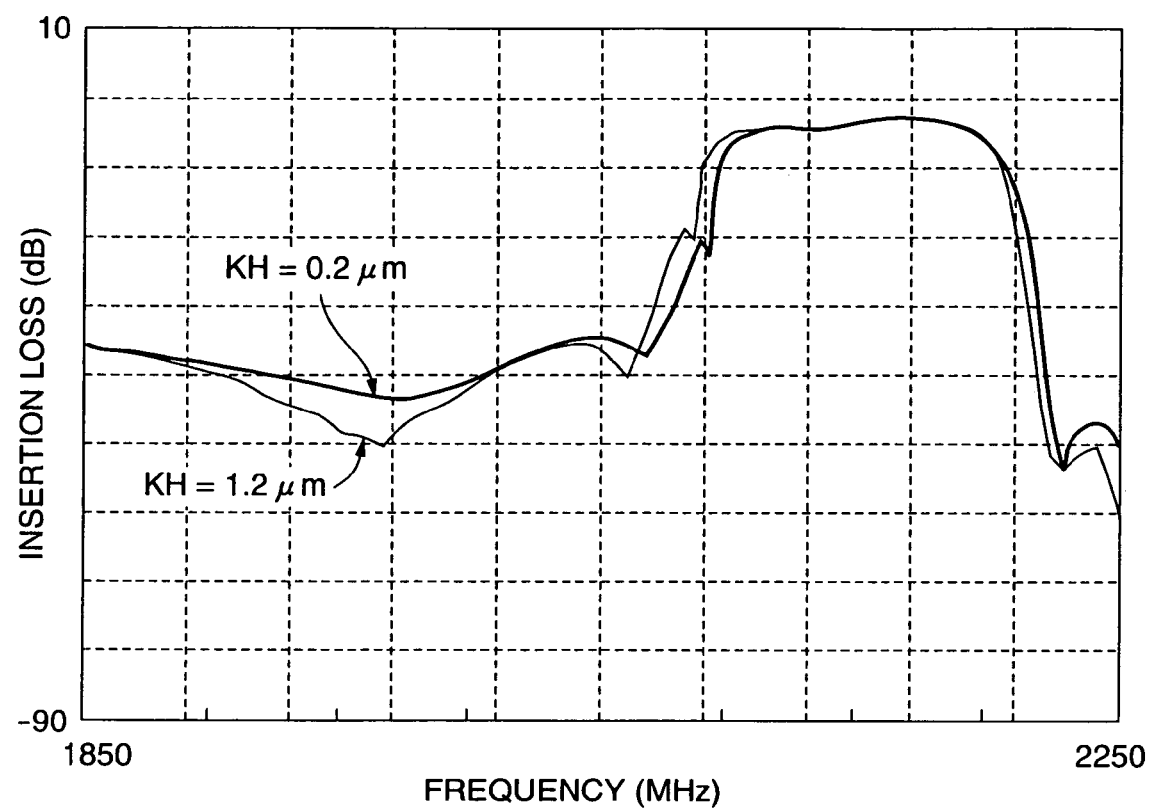
FIG. 22 is a graph for showing a relation between band frequency and insertion loss in the SAW element, when a film thickness KH of the wiring portion is 0.2 µm, 1.2 µm, respectively.
Figure 23:
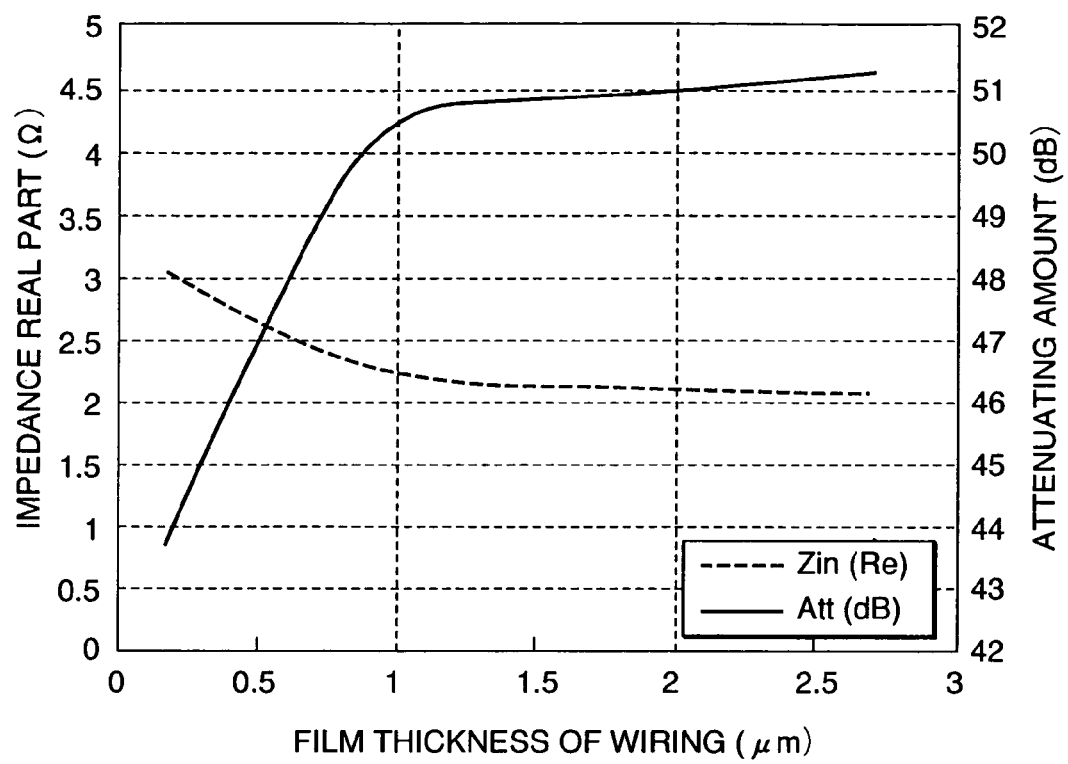
FIG. 23 is a graph for showing a relation between the film thickness of the wiring portion and amount of attenuation as well as real part of impedance.
Figure 24A:
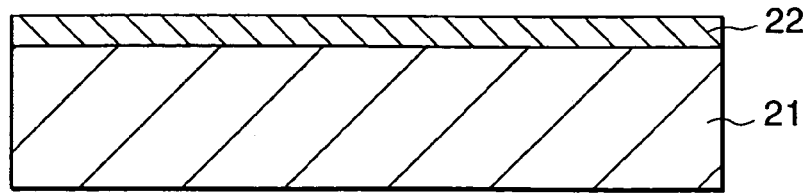
FIG. 24 is a sectional view for continuously showing an example of processes for forming a conductor pattern of the SAW element illustrated in FIG. 19.
Figure 24B:
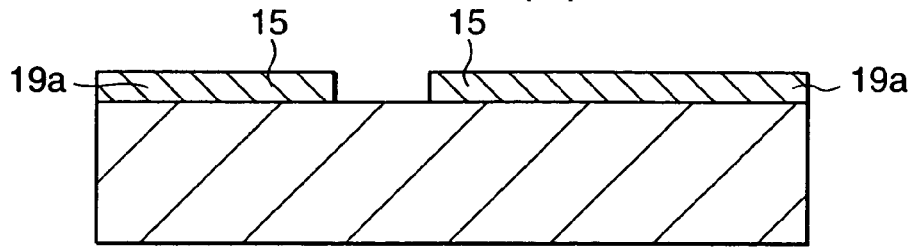
Figure 24C:
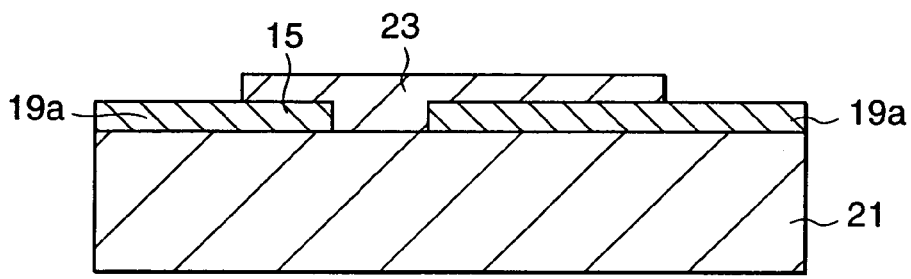
Figure 24D:
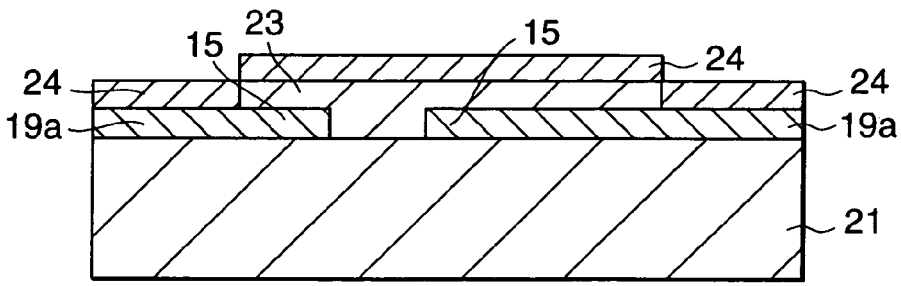
Figure 24E:
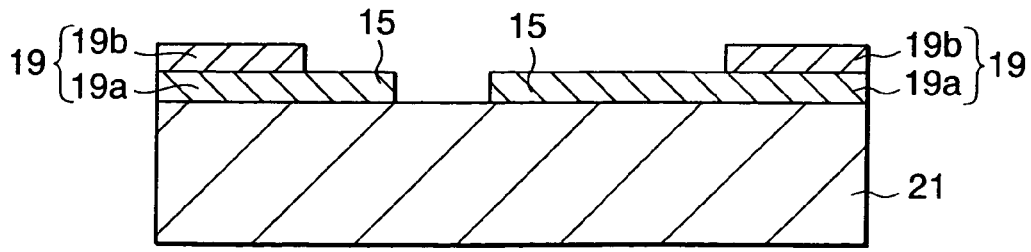
Figure 25A:
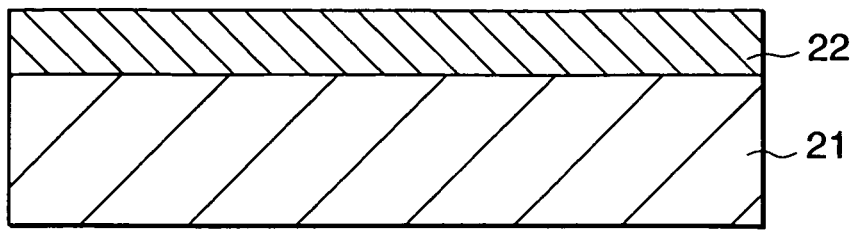
FIG. 25 is a sectional view for continuously showing another example of processes for forming a conductor pattern of the SAW element illustrated in FIG. 19.
Figure 25B:
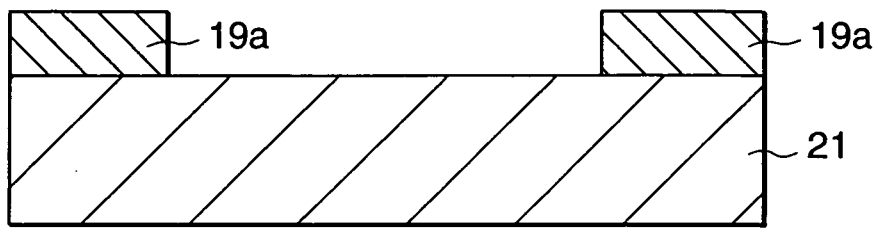
Figure 25C:
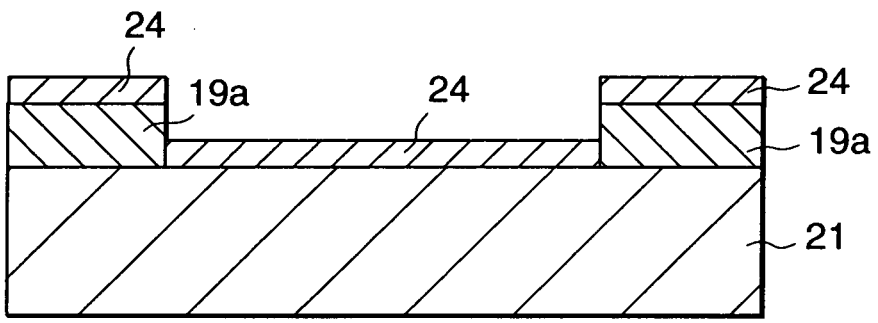
Figure 25D:
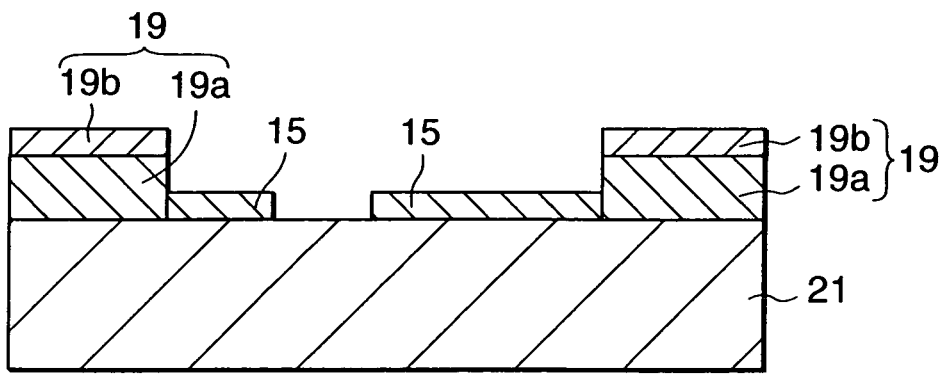

Now, referring to FIGS. 19 through 28, description will proceed to an SAW element according to a sixth embodiment of the present invention. FIG. 19 is a schematic view for showing a circuit of an SAW element according to a sixth embodiment of the present invention. FIG. 20 is a plan view for showing a feature portion in the SAW element illustrated in FIG. 19. FIG. 21 is a sectional view for showing the feature portion in the SAW element taken along — line of FIG. 20. FIG. 22 is a graph for showing a relation between band frequency and insertion loss in the SAW element, when a film thickness KH of the wiring portion is 0.2 μm, 1.2 μm, respectively. FIG. 23 is a graph for showing a relation between the film thickness of the wiring portion and amount of attenuation as well as real part of impedance. FIG. 24 is a sectional view for continuously showing an example of processes for forming a conductor pattern of the SAW element illustrated in FIG. 19. FIG. 25 is a sectional view for continuously showing another example of processes for forming a conductor pattern of the SAW element illustrated in FIG. 19. FIG. 26 is a sectional view for continuously showing yet another example of processes for forming a conductor pattern of the SAW element illustrated in FIG. 19. FIG. 27 is a sectional view for continuously showing still another example of processes for forming a conductor pattern of the SAW element illustrated in FIG. 19. FIG. 28 is a sectional view for continuously showing further another example of processes for forming a conductor pattern of the SAW element illustrated in FIG. 19.

As illustrated in FIG. 19, exciting electrode portions 15 resonant with an surface acoustic wave having a predetermined frequency are formed in a piezo-electric substrate of the SAW element 11 mounted on the SAW device 10. As illustrated in FIG. 19, an input terminal (electrode) 16 and an output terminal (electrode) 17 which electrically connect the exciting electrode portions 15 with the mounting substrate 12 and through which an electric signal to the exciting electrode portions 15 is inputted or outputted, and ground electrodes 18 are electrically connected to the exciting electrode portions 15 through wirings 19 in the SAW element 11. The wirings 19 electrically connect the exciting electrode portions 15 with the input terminal (electrode) 16, the output terminal (electrode) 17 and the ground electrodes 18. In addition, the wirings 19 electrically connect the exciting electrode portions 15 with each other.

The exciting electrode portions 15 and the wirings 19 are made of aluminum or aluminum alloy. However, materials other than the aluminum or the aluminum alloy may be contained in the exciting electrode portions 15 and the wirings 19. Besides, projecting electrodes 13 shown in FIG. 1 are formed on the input terminal (electrode) 16, the output terminal (electrode) 17 and the ground electrodes 18. The input terminal (electrode) 16, the output terminal (electrode) 17 and the ground electrodes 18 are then connected on the mounting substrate 12 through bumps by using ultrasonic waves. Alternatively, the input terminal (electrode) 16, the output terminal (electrode) 17 and the ground electrodes 18 are connected on the mounting substrate 12 by wire bonding. Besides, in a case of the connection by the bumps, an element-forming surface of the SAW element 11 is located opposite to the mounting substrate 12, on the contrary to the case of connection by wire bonding.

Herein, each of the exciting electrode portions 15 has a shape of the teeth of a comb with being involved in each other, as illustrated in FIG. 20. With the structure, by applying voltage on the exciting electrode portions 15 of the input side to be subjected to an electric field, a surface acoustic wave (SAW) is produced on the piezo-electric substrate by piezo-electric effects. On the other hand, mechanical strain due to thus produced surface acoustic wave (SAW) generates an electric field to be converted into an electric signal by the exciting electrode portions 15 of the output side.

At the both sides of each exciting electrode portion 15, reflectors 20 are located to reflect the surface acoustic wave (SAW). In this embodiment, the wirings 19 between the input terminal 16 and the output terminal 17 is formed to be a serial arm. Further, a plurality of parallel arms that are the wirings 19 are formed between the serial arm and the ground electrodes 18. Accordingly, the exciting electrode portions 15 are located in the serial arm and the parallel arms to constitute an RADA-type circuit. However, the other constitutions of a circuit can be used.

As illustrated in FIG. 21, each exciting electrode portion 15 has a first film thickness T1. Each wiring 19 continuously formed on the piezo-electric substrate 21 has a second film thickness T2 that is larger than the first film thickness T1. Concretely, the first film thickness T1 of each exciting electrode portion 15 is 0.2 µm in order that the pass-band frequency may be 2 GHz in this embodiment. On the other hand, the second film thickness T2 of each wiring 19 is 1.0 µm in this embodiment.

Thus, the second film thickness T2 of each wiring 19 is determined to be larger than the first film thickness T1 of each exciting electrode portion 15. Consequently, even if the film thickness of each exciting electrode portion 15 is designed to be smaller in order that the pass-band frequency may be expanded, cross section of the wiring 19 can be prevented from becoming small to increase an electronic resistance value thereof. As a result, insertion loss can be prevented from being deteriorated. Further, sufficient attenuating amount at a frequency range outside the pass-band still can be obtained. Characteristics of the element can be prevented from being deteriorated, even if the pass-band frequency is expanded.

Besides, it is enough that the second film thickness T2 is larger than the first film thickness T1. It is preferable that the second film thickness T2 is larger than the first film thickness T1 so that insertion loss as an SAW element may remain within a predetermined level and the attenuating amount at the frequency range outside the pass-band may be obtained up to a desirable level. The second film thickness T2 may have a value other than 1.0 µm. It is not necessary that film thickness of all of the wirings 19 are larger than the first film thickness T1 of the exciting electrode portion 15. Film thickness of a part of the wirings 19 can be larger than the first film thickness T1 of the exciting electrode portion 15. In addition, the input terminal (electrode) 16, the output terminal (electrode) 17 and the ground electrodes 18 may be formed to have the first film thickness T1, the second film thickness T2, or the other film thickness.

Herein, FIG. 22 shows a relation between band frequency and insertion loss in the SAW element, when a film thickness KH of the wiring portion is 0.2 µm, 1.2 µm, respectively. FIG. 23 shows a relation between the film thickness of the wiring portion and amount of attenuation as well as real part of impedance. As illustrated in FIG. 23, characteristics becomes better drastically in proportion to the thickness, until the second film thickness T2 reaches 1.0 µm. However, the characteristics do not become so better, after the second film thickness T2 exceeds 1.0 µm. It is therefore desirable that the second film thickness T2 is not larger than 1.0 µm. Further, it is more desirable that the second film thickness T2 is just 1.0 µm. However, the characteristics are still becoming a little better, when the second film thickness T2 is between 1.0 µm and 2.0 µm. The second film thickness T2 may be determined to be not larger than 2.0 µm.

Conductor patterns of the SAW element having the exciting electrode portions 15 of the first film thickness T1 and the wirings 19 of the second film thickness T2 are formed by the use of various thin film forming techniques. Accordingly, description proceeds to an example of forming processes of the conductor patterns. Besides, hereunder, sputtering method, vacuum evaporation method, or the like are used for forming the thin film. Further, wet etching, dry etching, and the like are used for patterning the thin film.

The first example is called "lift-off" method illustrated in FIG. 24. Namely, as illustrated in FIG. 24 (a), at first, a first conductive film 22 is formed on the piezo-electric substrate 21. Next, as illustrated in FIG. 24(b), the first conductive film 22 is subjected to patterning to simultaneously form the exciting electrode portions 15 and a lower layer portion 19a of the wirings 19. Further, as illustrated in FIG. 24(c), a photo resist film 23 is formed thereon with areas corresponding with the lower layer portion 19a of the wirings 19 being exposed (opened). Next, as illustrated in FIG. 24(d), a second conductive film 24 is formed on the photo resist film 23 and the lower layer portion 19a exposed from the photo resist film 23. At the last, the photo resist film 23 is removed, so that the second conductive film 24 remains only on the lower layer portion 19a to become an upper layer portion 19b of the wirings 19. As a result, as illustrated in FIG. 24(e), the wirings 19 having a larger thickness than that of the exciting electrode portions 15 are formed.

The second example is illustrated in FIG. 25. Namely, as illustrated in FIG. 25(a), at first, a first conductive film 22 is formed on the piezo-electric substrate 21. The first conductive film 22 is then subjected to patterning to form a lower layer portion 19a of the wirings 19, as illustrated in FIG. 25(b). Next, as illustrated in FIG. 25(c), a second conductive film 24 is formed thereon. The second conductive film 24 is then subjected to a photo process, etching process, and the like for pattering. As a result, as illustrated in FIG. 25(d), the exciting electrode portions 15 and an upper layer portion 19b of the wirings 19 are formed.

The third example is illustrated in FIG. 26. Namely, as illustrated in FIG. 26(a), at first, a first conductive film 22 is formed on the piezo-electric substrate 21. Next, as illustrated in FIG. 26(b), the first conductive film 22 is subjected to patterning to simultaneously form the exciting electrode portions 15 and a lower layer portion 19a of the wirings 19. Further, as illustrated in FIG. 26(c), a second conductive film 24 and a third conductive film 25 are one by one formed thereon.

Figure 26A:
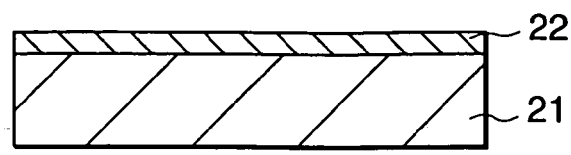
FIG. 26 is a sectional view for continuously showing yet another example of processes for forming a conductor pattern of the SAW element illustrated in FIG. 19.
Figure 26B:
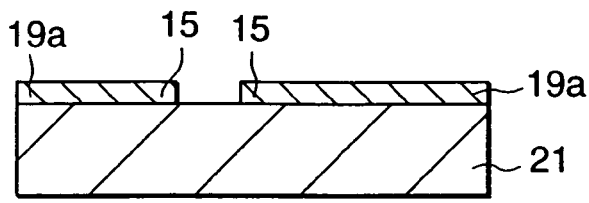
Figure 26C:
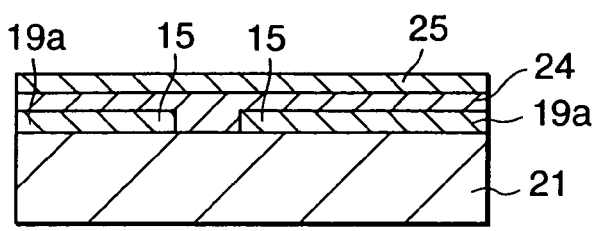
Figure 26D:
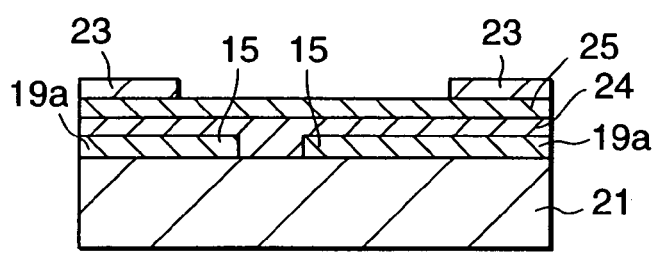
Figure 26E:
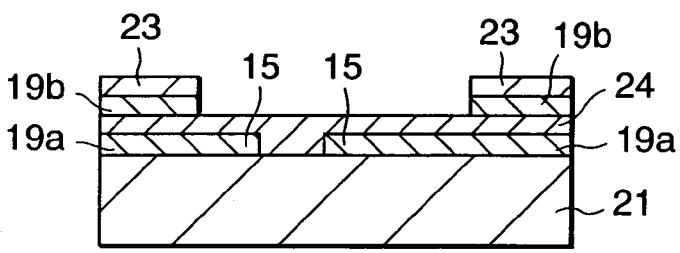
Figure 26F:
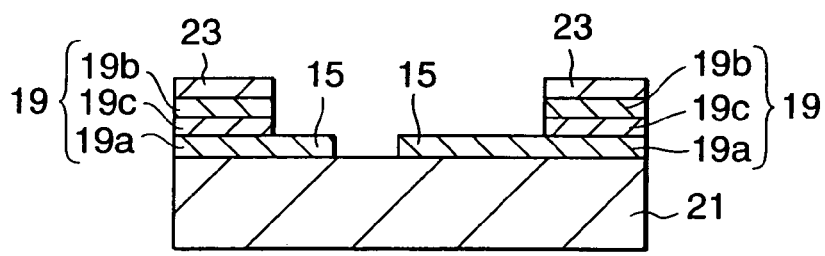
Figure 26G:
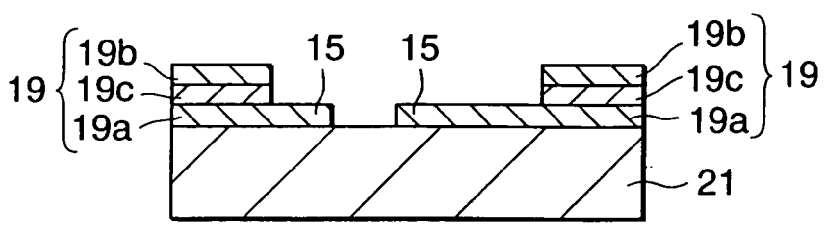
Figure 27A:
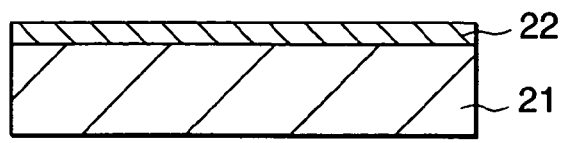
FIG. 27 is a sectional view for continuously showing still another example of processes for forming a conductor pattern of the SAW element illustrated in FIG. 19.
Figure 27B:
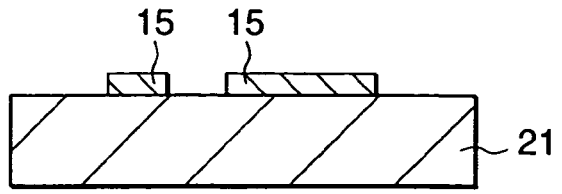
Figure 27C:
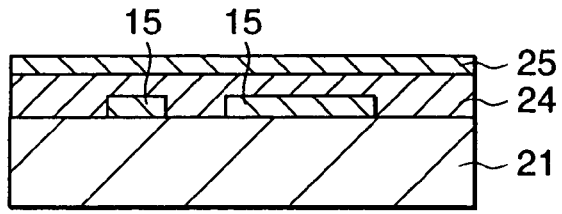
Figure 27D:
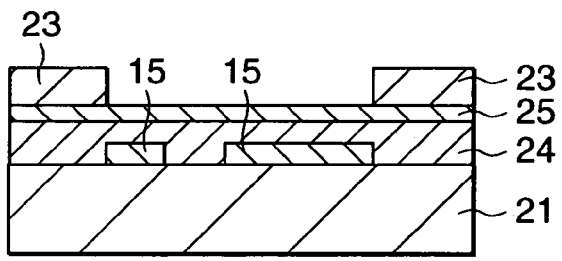
Figure 27E:
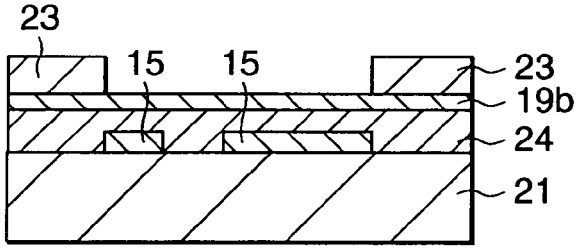
Figure 27F:
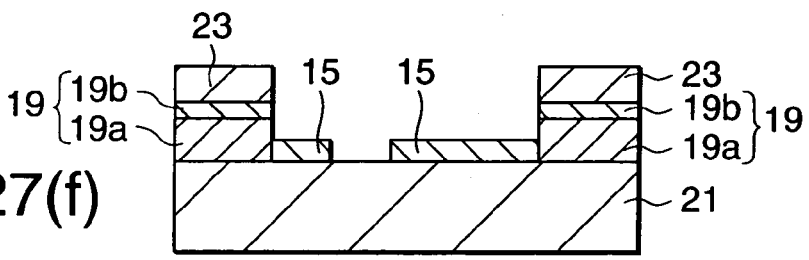
Figure 27G:
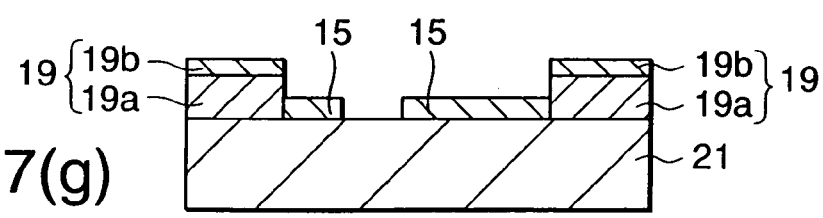
Figure 28A:
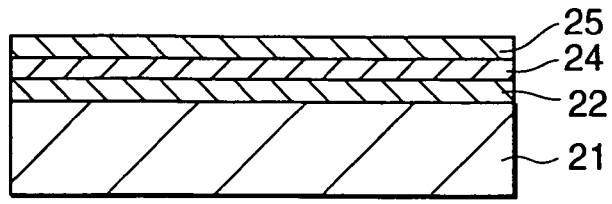
FIG. 28 is a sectional view for continuously showing further another example of processes for forming a conductor pattern of the SAW element illustrated in FIG. 19.
Figure 28B:
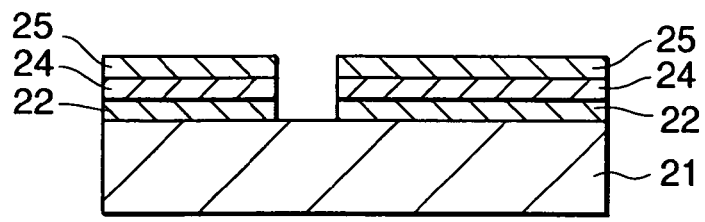
Figure 28C:
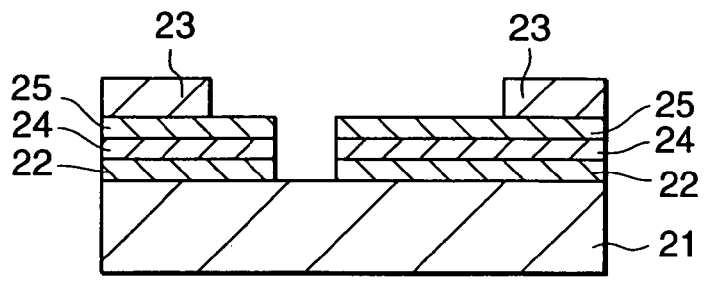
Figure 28D:
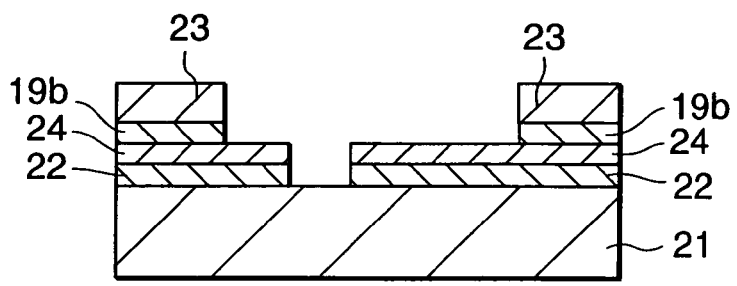
Figure 28E:
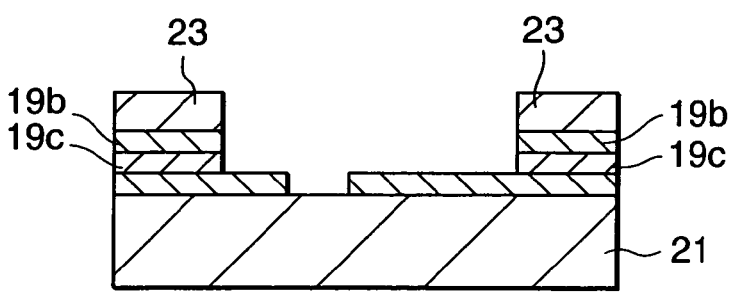
Figure 28F:
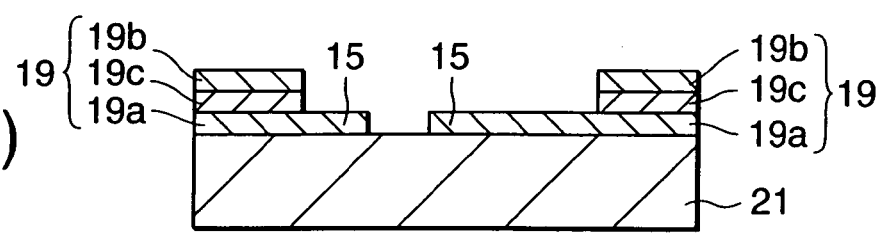

Herein, including fourth and fifth examples that will be described below, the second conductive film 24 is made, for example, of chromium while the third conductive film 25 is made, for example, of aluminum. Alternatively, the second conductive film 24 and the third conductive film 25 are made of aluminum alloy to which additive materials different from each other are added. Next, a photo resist film 23 is formed on the third conductive film 25. The photo resist film 23 is then subjected to patterning to remain only the areas corresponding to a lower layer portion 19a of the wirings 19, as illustrated in FIG. 26(d). Under this condition, the third conductive film 25 is etched. The third conductive film 25 is removed except only the areas positioned under the photo resist film 23, as illustrated in FIG. 26(e). An upper layer portion 19b of the wirings 19 are formed by the areas positioned under the photo resist film 23. Next, the second conductive film 24 is etched. The second conductive film 24 is removed except only the same areas as the upper layer portion 19b, as illustrated in FIG. 26 (f). An intermediate layer portion 19c of the wirings 19 are formed thereby. At the last, the photo resist film 23 is removed. As a result, as illustrated in FIG. 26(g), the wirings 19 having a larger thickness than that of the exciting electrode portions 15 are formed.

The fourth example is illustrated in FIG. 27. Namely, as illustrated in FIG. 27(a), at first, a first conductive film 22 is formed on the piezo-electric substrate 21. Next, as illustrated in FIG. 27(b), the first conductive film 22 is subjected to patterning to form the exciting electrode portions 15. Further, as illustrated in FIG. 27(c), a second conductive film 24 and a third conductive film 25 are one by one formed thereon. Next, a photo resist film 23 is formed on the third conductive film 25. The photo resist film 23 is then subjected to patterning to remain only the areas corresponding to the wirings 19, as illustrated in FIG. 27 (d). Under this condition, the third conductive film 25 is etched. The third conductive film 25 is removed except only the areas positioned under the photo resist film 23, as illustrated in FIG. 27(e). An upper layer portion 19b of the wirings 19 are formed by the areas positioned under the photo resist film 23. Next, the second conductive film 24 is etched. The second conductive film 24 is removed except only the same areas as the upper layer portion 19b, as illustrated in FIG. 27(f). A lower layer portion 19a of the wirings 19 are formed thereby. As a result, the wirings 19 comprising the lower layer portion 19a and the upper layer portion 19b and having a larger thickness than that of the exciting electrode portions 15 are formed. At the last, the photo resist film 23 is removed, as illustrated in FIG. 27(g).

The fifth example is illustrated in FIG. 28. Namely, as illustrated in FIG. 28(a), at first, a first conductive film 22, a second conductive film 24 and a third conductive film 25 are one by one formed on the piezo-electric substrate 21. Next, as illustrated in FIG. 28(b), these first conductive film 22, second conductive film 24 and third conductive film 25 are formed to have patterns corresponding to the exciting electrode portions 15 and the wirings 19. Next, a photo resist film 23 is formed on the third conductive film 25. The photo resist film 23 is then subjected to patterning to remain only the areas corresponding to the wirings 19, as illustrated in FIG. 28(c). Under this condition, the third conductive film 25 is etched. The third conductive film 25 is removed except only the areas positioned under the photo resist film 23, as illustrated in FIG. 28(d). An upper layer portion 19b of the wirings 19 are formed thereby. Next, the second conductive film 24 is removed except only the areas positioned under the third conductive film 25, as illustrated in FIG. 28(e). An intermediate layer portion 19c of the wirings 19 are formed thereby. At the last, the photo resist film 23 is removed, so that the wirings 19 having a larger thickness than that of the exciting electrode portions 15 are formed, as illustrated in FIG. 28(g).

Besides, the conductor patterns of the SAW element having the exciting electrode portions 15 of the first film thickness T1 and the wirings 19 of the second film thickness T2 can be formed by the other methods.

Besides, the above description was made about the SAW device on which only one SAW element 11 is mounted. The SAW element of the present invention can be applied to various types of SAW devices. For example, two SAW elements 11 having center frequencies different from each other may be mounted on the SAW device to produce a branching filter.

Thus, the second film thickness T2 of each wiring 19 is determined to be larger than the first film thickness T1 of each exciting electrode portion 15. Consequently, even if the film thickness of each exciting electrode portion 15 is designed to be smaller in order that the pass-band frequency may be expanded, cross section of the wiring 19 can be prevented from becoming small to increase an electronic resistance value thereof. As a result, insertion loss can be prevented from being deteriorated. Further, sufficient attenuating amount at a frequency range outside the pass-band still can be obtained. Characteristics of the element can be prevented from being deteriorated, even if the pass-band frequency is expanded.

What is claimed is:

1. An SAW device in which an SAW element is mounted, said SAW element including a ladder-type circuit which has a serial arm formed between input and output terminals and which has a plurality of parallel arms formed between said serial arm and a reference potential terminal, said SAW device comprising:
 a plurality of first SAW resonators which are located in said serial arm and each of which has a predetermined resonant frequency;
 second SAW resonators which are located in said plurality of parallel arms, respectively, and each of which has an anti-resonant frequency corresponding with said predetermined resonant frequency of said each first SAW resonator; and
 capacitance means which has a predetermined electrostatic capacity and which is interconnected between an output node of a resonator located in a parallel arm positioned in a nearest position of said input terminal and an output node of a resonator located in a parallel arm positioned in a nearest position of said output terminal.

2. An SAW device as claimed in claim 1, wherein said capacitance means is formed in said SAW element.

3. An SAW device as claimed in claim 2, wherein said SAW device comprises a branching filter in which two SAW elements are mounted, said two SAW elements having center frequencies different from each other.

4. An SAW device as claimed in claim 1, wherein said capacitance means interconnects two points in said two parallel arms at which an inductance means connects each said parallel arm to said reference potential terminal.

5. An SAW element comprising:
 a first wiring portion formed between input and output terminals;
 a plurality of second wiring portions formed between said first wiring portion and a reference potential terminal;
 at least two single unit elements;
 each of said single unit elements including:
  a first SAW resonator which is located in said first wiring portion and which has a predetermined resonant frequency and a predetermined anti-resonant frequency;
  a second SAW resonator which is connected to said second wiring portion of the side of said input terminal of said first SAW resonator and which has an anti-resonant frequency corresponding with said predetermined resonant frequency of said first SAW resonator;
  a third SAW resonator which is connected to said second wiring portion of the side of said output terminal of said first SAW resonator and which has an anti-resonant frequency corresponding with said predetermined resonant frequency of said first SAW resonator;
  a first connection paint for connecting said second SAW resonator of the side of said reference potential terminal and said third SAW resonator of the side of said reference potential terminal with each other; and
  a first inductance element which is located between said first connection point and said reference potential terminal,
 wherein said SAW element further comprises a second connection point for connecting the side of said reference potential terminal of said first inductance element in a respective single unit element to each other, and a second inductance element which is located between said second connection point and said reference potential terminal.

6. An SAW device including said SAW element claimed in claim 5, said SAW element being mounted on said SAW device.

7. An SAW device including two said SAW elements which are mounted on said SAW device and which have center frequencies different from each other, wherein at least one of the two SAW elements comprises a branching filter comprising the SAW element as claimed in claim 5.

8. An SAW element comprising:
 a first wiring portion formed between input and output terminals;
 a plurality of second wiring portions formed between said first wiring portion and a reference potential terminal; and
 at least two single unit elements,
 each of said single unit elements including:
  a first SAW resonator which is located in said first wiring portion and which has a predetermined resonant frequency and a predetermined anti-resonant frequency;
  a second SAW resonator which is connected to said second wiring portion of the side of said input terminal of said first SAW resonator and which has an anti-resonant frequency corresponding with said predetermined resonant frequency of said first SAW resonator;
  a third SAW resonator which is connected to said second wiring portion of the side of said output terminal of said first SAW resonator and which has an anti-resonant frequency corresponding with said predetermined resonant frequency of said first SAW resonator;
  a first connection point for connecting said second SAW resonator of the side of said reference potential terminal and said third SAW resonator of the side of said reference potential terminal with each other; and
  a first inductance element which is located between said first connection point and said reference potential terminal,
 wherein each said single unit element provides an substantially identical frequency response comprising a bandpass filter having:
  an attenuating pole fs caused by said resonant frequency or said first SAW resonator;
  an attenuating pole fp caused by said resonant frequency of said second SAW resonator and said third SAW resonator; and
  attenuating poles f1 and f2 caused by an electrostatic capacity of said first SAW resonator, an electrostatic capacity of said second SAW resonator, and an inductance of said first inductance element.

9. An SAW element as claimed in claim 8, wherein respective said predetermined resonant frequency of each of said single unit elements are corresponding with each other.

10. An SAW device including said SAW element claimed in claim 9, said SAW element being mounted on said SAW device.

11. An SAW element as claimed in claim 8, wherein said SAW element further comprises a capacitance element, said capacitance element being located in at least any one of the positions between said first SAW resonators adjacent to each other, between said input terminal and said first SAW resonator, and between said output terminal and said first SAW resonator.

12. An SAW device including said SAW element claimed in claim 11, said SAW element being mounted on said SAW device.

13. An SAW device including said SAW element claimed in claim 8, said SAW element being mounted on said SAW device.

14. An SAW device including two said SAW elements which are mounted on said SAW device and which have center frequencies different from each other, wherein at least one of the two SAW elements comprises a branching filter comprising the SAW element as claimed in claim 8.

15. An SAW element as claimed in claim 8, wherein said SAW element further comprises a fourth SAW resonator, said fourth SAW resonator being located in at least any one of the positions between said first SAW resonators adjacent to each other, between said input terminal and said first SAW resonator, and between said output terminal and said first SAW resonator.

16. An SAW device including said SAW element claimed in claim 15, said SAW element being mounted on said SAW device.

17. An SAW device comprising:
   a mounting substrate on which a predetermined conductor pattern is formed;
   a first SAW element which is mounted on said mounting substrate by a flip-chip mounting, said first SAW element having a piezo-electric substrate and an SAW resonator formed on said piezo-electric substrate, said first SAW element further having input and output terminals which are formed in one of the both sides of a central axis of said piezo-electric substrate and which are electrically connected to said SAW resonator; and
   a second SAW element which is mounted on said mounting substrate adjacent to said first SAW element by a flip-chip mounting, said second SAW element having a piezo-electric substrate and an SAW resonator formed on said piezo-electric substrate, said second SAW element further having input and output terminals which are formed in the side remote from said first SAW element and which are electrically connected to said SAW resonator, said input and output terminals being formed in the side remoter from said first SAW element than from said central axis of said piezo-electric substrate.

18. An SAW device as claimed in claim 17, wherein said first SAW element and said second SAW element are formed in a body or separately from each other.

19. An SAW device as claimed in claim 17, wherein said SAW device includes one or a plurality of said first SAW elements and said second SAW elements, respectively.

20. An SAW device as claimed in claim 17, wherein said first SAW element and said second SAW element have center frequencies different from each other, said first SAW element comprising a reception filter and said second SAW element comprising a transmission filter.

21. An SAW device as claimed in claim 17, wherein input and output terminals of said first SAW element as well as said input and output terminals of said second SAW element are formed on a side surface at the side parallel to said central axis of said piezo-electric substrate.

22. An SAW device as claimed in claim 17, wherein said input and output terminals of said first SAW element, and said input and output terminals of said second SAW element are formed on corner portions of said piezo-electric substrates, respectively, said corner portions being different from each other.

23. An SAW device including two SAW elements which are mounted on said SAW device and which have center frequencies different from each other, wherein at least one of the two SAW elements comprises a branching filter comprising a SAW element comprising:
   a first wiring portion formed between input and output terminals;
   a plurality of second wiring portions formed between said first wiring portion and a reference potential terminal; and
   at least two single unit elements,
   each of said single unit elements including:
      a first SAW resonator which is located in said first wiring portion and which has a predetermined resonant frequency and a predetermined anti-resonant frequency;
      a second SAW resonator which is connected to said second wiring portion of the side of said input terminal of said first SAW resonator and which has an anti-resonant frequency corresponding with said predetermined resonant frequency of said first SAW resonator;
      a third SAW resonator which is connected to said second wiring portion of the side of said output terminal of said first SAW resonator and which has an anti-resonant frequency corresponding with said predetermined resonant frequency of said first SAW resonator;
      a first connection point for connecting said second SAW resonator of the side of said reference potential terminal and said third SAW resonator of the side of said reference potential terminal with each other; and
      a first inductance element which is located between said first connection point and said reference potential terminal,
   wherein respective said predetermined resonant frequency of each of said single unit elements is corresponding with each other and
   the predetermined resonant frequency of the single unit element comprises an electrostatic capacitance of the first SAW resonator, the second SAW resonator, the third SAW resonator, and the first inductance unit.

* * * * *